(12) United States Patent
Solin et al.

(10) Patent No.: US 8,497,459 B2
(45) Date of Patent: Jul. 30, 2013

(54) METHOD AND APPARATUS FOR HIGH RESOLUTION PHOTON DETECTION BASED ON EXTRAORDINARY OPTOCONDUCTANCE (EOC) EFFECTS

(75) Inventors: Stuart A. Solin, St. Louis, MO (US); Samuel A. Wickline, St. Louis, MO (US); Akm Shah Newaz, Nashville, TN (US); Kirk D. Wallace, St. Louis, MO (US)

(73) Assignee: Washington University, St. Louis, MO (US)

( * ) Notice: Subject to any disclaimer, the term of this patent is extended or adjusted under 35 U.S.C. 154(b) by 183 days.

(21) Appl. No.: 12/986,621

(22) Filed: Jan. 7, 2011

(65) Prior Publication Data

US 2011/0233382 A1 Sep. 29, 2011

Related U.S. Application Data

(60) Provisional application No. 61/293,442, filed on Jan. 8, 2010.

(51) Int. Cl.
*H01J 29/02* (2006.01)
*H01J 40/14* (2006.01)

(52) U.S. Cl.
USPC ..................... 250/208.1; 250/214 R

(58) Field of Classification Search
USPC ............. 250/208.1, 214 R; 257/448, 471, 257/449
See application file for complete search history.

(56) References Cited

U.S. PATENT DOCUMENTS

| | | | |
|---|---|---|---|
| 5,699,215 | A | 12/1997 | Solin et al. |
| 5,965,283 | A | 10/1999 | Solin et al. |
| 6,245,601 | B1 | 6/2001 | Kobayashi et al. |
| 6,531,740 | B2 | 3/2003 | Bosco et al. |
| 6,707,122 | B1 | 3/2004 | Hines et al. |
| 6,714,374 | B1 | 3/2004 | Hayashi et al. |
| 6,756,651 | B2 | 6/2004 | Bozso et al. |
| 6,806,508 | B2 | 10/2004 | D'Evelyn et al. |
| 6,881,979 | B2 | 4/2005 | Starikov et al. |

(Continued)

FOREIGN PATENT DOCUMENTS

| | | |
|---|---|---|
| JP | 2005227155 A | 8/2005 |
| WO | 98/12554 A1 | 3/1998 |

(Continued)

OTHER PUBLICATIONS

Solin, Magnetic Field Nanosensors, 2004, Scientific American, 291, 71.*

(Continued)

*Primary Examiner* — Tony Ko
(74) *Attorney, Agent, or Firm* — Thompson Coburn LLP

(57) ABSTRACT

The inventors disclose a new high performance optical sensor, preferably of nanoscale dimensions, that functions at room temperature based on an extraordinary optoconductance (EOC) phenomenon, and preferably an inverse EOC (I-EOC) phenomenon, in a metal-semiconductor hybrid (MSH) structure having a semiconductor/metal interface. Such a design shows efficient photon sensing not exhibited by bare semiconductors. In experimentation with an exemplary embodiment, ultrahigh spatial resolution 4-point optoconductance measurements using Helium-Neon laser radiation reveal a strikingly large optoconductance property, an observed maximum measurement of 9460% EOC, for a 250 nm device. Such an exemplary EOC device also demonstrates specific detectivity higher than $5.06 \times 10^{11}$ cm$\sqrt{\text{Hz}}$/W for 632 nm illumination and a high dynamic response of 40 dB making such sensors technologically competitive for a wide range of practical applications.

98 Claims, 13 Drawing Sheets

U.S. PATENT DOCUMENTS

| | | | |
|---|---|---|---|
| 6,933,503 | B2 | 8/2005 | Sipila et al. |
| 7,052,588 | B2 | 5/2006 | Gu et al. |
| 7,082,838 | B2 | 8/2006 | Rowe et al. |
| 7,192,873 | B1 | 3/2007 | Kim et al. |
| 7,223,960 | B2 | 5/2007 | Mouli |
| 8,436,436 | B2 | 5/2013 | Solin et al. |
| 2002/0084429 | A1 | 7/2002 | Craighead et al. |
| 2002/0129087 | A1 | 9/2002 | Cachin et al. |
| 2002/0192653 | A1 | 12/2002 | Stetter et al. |
| 2004/0008453 | A1 | 1/2004 | Nie |
| 2004/0129069 | A1 | 7/2004 | Sakawa et al. |
| 2004/0129087 | A1 | 7/2004 | Rowe et al. |
| 2005/0199731 | A9 | 9/2005 | Empedocles et al. |
| 2006/0036194 | A1 | 2/2006 | Schultheiss et al. |
| 2006/0228723 | A1 | 10/2006 | Bradley et al. |
| 2009/0026082 | A1 | 1/2009 | Rothberg et al. |
| 2009/0152664 | A1 | 6/2009 | Klem et al. |
| 2009/0326337 | A1* | 12/2009 | Solin et al. ............ 600/300 |

FOREIGN PATENT DOCUMENTS

| | | |
|---|---|---|
| WO | 01/41214 A1 | 6/2001 |
| WO | 02/25749 A2 | 3/2002 |
| WO | 2008/115258 A2 | 9/2008 |
| WO | 2011/085220 A2 | 7/2011 |

OTHER PUBLICATIONS

International Search Report and Written Opinion for PCT/US2011/020545 dated Aug. 29, 2011.

Office Action for AU Application 2007349279 issued Jul. 28, 2011.

Office Action for U.S. Appl. No. 12/375,861 dated Nov. 25, 2011.

Solin et al., "Geometry Driven Interfacial Effects in Nanoscopic and Macroscopic Semiconductor Metal Hybrid Structures: Extraordinary Magnetoresistance and Extraordinary Piezoconductance", Proc. of the International Symposium on Clusters and Nanoassemblies, 2003, Richmond.

Office Action for U.S. Appl. No. 12/375,861 dated Feb. 10, 2012.

Summons to Attend Oral Proceedings for EP Application 07874412.5 dated May 25, 2012.

Papo et al., "New Lytic Peptides Based on the D,L-Amphipathic Helix Motif Preferentially Kill Tumor Cells Compared to Normal Cells", Biochemistry, 2003, pp. 9346-9354, vol. 42, No. 31.

Park et al., "Multispectral digital microscopy for in vivo monitoring of oral neoplasia in the hamster cheek pouch of carcinogenesis", Optics Express, 2005, pp. 749-762, vol. 13, No. 3.

Partial European Search Report for EP Application 09010537.0 dated Feb. 24, 2010.

Pashkin et al., "Room-Temperature A1 Single-Electron Transistor Made by Electron-Beam Lithography", Applied Physics Letters, 2000, pp. 2256-2258, vol. 76, No. 16.

Primakoff et al., "Diffraction of Sound around a Circular Disk", The Journal of the Acoustical Society of Ameria, pp. 132-142, Jan. 1947, vol. 19, No. 1.

Qin et al., "Staining intensity of individual osteons correlated with elastic properties and degrees of mineralization", Journal of Bone and Mineral Metabolism, 2001, pp. 359-364, vol. 19.

Recchia et al., "Sensitive Detection of Abnormal Aortic Architecture in Marfan Syndrome With High-Frequency Ultrasonic Tissue Characterization", Circulation, 1995, pp. 1036-1043, vol. 91.

Rowe et al., "A Uniaxial Tensile Stress Apparatus for Temperature-Dependent Magnetotransport and Optical Studies of Thin Films", Review of Scientific Instruments, 2002, pp. 4270-4276, vol. 73, No. 12.

Rowe et al., "Enhanced Room-Temperature Piezoconductance of Metal-Semiconductor Hybrid Structures", Applied Physics Letters, 2003, pp. 1160-1162, vol. 83, No. 6.

Rowe et al., "Giant Room-Temperature Piezoresistance in a Metal-Silicon Hybrid Structure", Physical Review Letters, 2008, pp. 145501, vol. 100.

Saijo et al., "Acoustic Properties of Atherosclerosis of Human Aorta Obtained with High-Frequency Ultrasound", Ultrasound in Medicine and Biology, 1998, pp. 1061-1064, vol. 24, No. 7.

Saijo et al., "Application of Scanning Acoustic Microscopy for Assessing Stress Distribution in Atherosclerotic Plaque", Annals of Biomedical Engineering, 2001, pp. 1048-1053, vol. 29.

Saijo et al., "Evaluation of the Inner-Surface Morphology of an Artificial Heart by Acoustic Microscopy", Artificial Organs, 2000, pp. 64-69, vol. 24, No. 1.

Saijo et al., "Ultrasonic tissue characterization of collagen in lipid-rich plaques in apoE-deficient mice", Atherosclerosis, 2001, pp. 289-295, vol. 158.

Saijo et al., "Ultrasonic Tissue Characterization of Infarcted Myocardium by Scanning Acoustic Microscopy", Ultrasound in Medicine & Biology, 1997, pp. 77-85, vol. 23, No. 1.

Saijo et al., "Visualization of human umbilical vein endothelial cells by acoustic microscopy", Ultrasonics, 2000, pp. 396-399, vol. 38.

Sasaki et al., "Influence of Tissue Preparation on the Acoustic Properties of Tissue Sections at High Frequencies", Ultrasound in Medicine & Biology, 2003, pp. 1367-1372, vol. 29, No. 9.

Schenk, "Acoustic Microscopy of Red Blood Cells" The Journal of Histochemistry and Cytochemistry, 1988, pp. 1341-1351, vol. 36, No. 10.

Seidler et al., "Dynamical Current Redistribution and Non-Gaussian 1/f Noise", Physical Review Letters, Apr. 1996, pp. 3049-3052, vol. 76, No. 17.

Seidler et al., "Non-Gaussian 1/f noise: Experimental optimization and separation of high-order amplitude and phase correlations", Physical Review B, Apr. 1996, pp. 9753-9759, vol. 53, No. 15.

Sennoune et al., "Vacuolar H+-ATPase in human breast cancer cells with distinct metastatic potential: distribution and functional activity", American Journal of Physiology-Cell Physiology, 2004, pp. C1443-C1452, vol. 286.

Shaban et al., "Characterization of near-infrared n-type b-FeSi2/p-type Si heterojunction photodiodes at room temperature", Applied Physics Letters, 2009, pp. 222113, vol. 94.

Shalaby et al., "Development of novel substrates for tumor immunotherapy", Journal of Controlled Release, 2003, pp. 209-224, vol. 91.

Sherman, "Integral-Transform Formulation of Diffraction Theory", Journal of the Optical Society of America, Dec. 1967, pp. 1490-1498, vol. 57, No. 12.

Shewell et al., "Inverse Diffraction and a New Reciprocity Theorem", Journal of the Optical Society of America, Dec. 1968, pp. 1596-1603, vol. 58, No. 12.

Skala et al., "Investigation of Fiber-Optic Probe Designs for Optical Spectroscopic Diagnosis of Epithelial Pre-Cancers", Lasers in Surgery and Medicine, 2004, pp. 25-38, vol. 34.

Sokolov et al., "Polarized Reflectance Spectroscopy for Pre-Cancer Detection", Technology in Cancer Research & Treatment, Feb. 2004, pp. 1-14, vol. 3, No. 1.

Solin et al., "Enhanced Room-Temperature Geometric Magnetoresistance in Inhomogeneous Narrow-Gap Semiconductors", Science, Sep. 2000, pp. 1530-1532, vol. 289.

Solin et al., "Nonmagnetic Semiconductors as Read-Head Sensors for Ultra-High-Density Magnetic Recording", Applied Physics Letters, 2002, pp. 4012-4014, vol. 80, No. 21.

Solin et al., "Room Temperature Extraordinary Magnetoresistance of Nonmagnetic Narrow-Gap Semiconductor/Metal Composites: Application to Read-Head Sensors for Ultrahigh-Density Magnetic Recording", IEEE Transactions on Magnetics, 2002, pp. 89-94, vol. 38, No. 1.

Solin et al., "Self-Biasing Nonmagnetic Giant Magnetoresistance Sensor", Applied Physics Letters, 1996, pp. 4105-4107, vol. 69.

Spechler, "Review article: what I do now to manage adenocarcinoma risk, and what I may be doing in 10 years' time", Alimentary Pharmacology & Therapeutics, 2004, pp. 105-110, vol. 20.

Stiborova et al., "Monitoring of DNA Adducts in Humans and 32P-Postlabeling Methods. A Review.", Collection of Czechoslovak Chemical Communications, 2004, pp. 476-498, vol. 69.

Suzuki et al., "Paclitaxel Prevents Loss of Pulmonary Endothelial Barrier Integrity During Cold Preservation", Transplantation, Aug. 2004, pp. 524-529, vol. 78, No. 4.

Svistun et al., "Vision Enhancement System for Detection of Oral Cavity Neoplasia Based on Autofluorescence", Head and Neck—Journal for the Sciences and Specialities of the Head and Neck, Mar. 2004, pp. 205-215, vol. 26.

Szachowicz-Petelska et al., "Changes in physico-chemical properties of human large intestine tumour cells membrane", Molecular and Cellular Biochemistry, 2002, pp. 41-47, vol. 238.

Sze, "Physics of Semiconductor Devices", Second Edition, 1981, pp. 793-795, Wiley-Interscience, New York.

Thethi et al., "Decreased Cell Surface Charge in Cystic Fibrosis Epithelia", Cell Biochemistry and Function, 1997, pp. 35-38, vol. 15.

Tomeckova et al., "Comparison of effect of selected synthetic chalcone analogues on mitochondrial outer membrane determined by fluorescence spectroscopy", Journal of Biochemical and Biophysical Methods, 2004, pp. 135-141, vol. 61.

Trynda-Lemiesz, "Human serum albumin: spectroscopic studies of the paclitaxel binding and proximity relationships with cisplatin and adriamycin", Journal of Inorganic Biochemistry, 2004, pp. 1851-1856, vol. 98.

Tunnell et al., "Instrumentation for Multi-modal Spectroscopic Diagnosis of Epithelial Dysplasia", Technology in Cancer Research & Treatment, 2003, pp. 505-514, vol. 2, No. 6.

Vesely et al., "Subtraction Scanning Acoustic Microscopy Reveals Motility Domains in Cells In Vitro", Cell Motility and the Cytoskeleton, 1994, pp. 231-240, vol. 29.

Vigano et al., "Structure, Orientation, and Conformational Changes in Transmembrane Domains of Multidrug Transporters", Accounts of Chemical Research, 2005, pp. 117-126, vol. 38.

Wang et al., "Extraordinary electroconductance in metal-semiconductor hybrid structures", Applied Physics Letters, 2008, pp. 262106, vol. 92.

Wieland et al., "Experimental measurement and finite-element modeling of extraordinary optoconductance in GaAs-In metal-semiconductor hybrid structures", Physical Review B, 2006, 155305, vol. 73.

Wieland et al., "Extraordinary optoconductance in metal-semiconductor hybrid structures", Applied Physics Letters, 2006, 052105, vol. 88.

Wolf et al., "Comparison of the Kirchhoff and the Rayleigh-Sommerfeld Theories of Diffraction at an Aperture", Journal of the Optical Society of America, May 1964, pp. 587-594, vol. 54, No. 5.

Wright et al., "Use of visual screening methods for cervical cancer screening", Obstetrics and Gynecology Clinics of North America, 2002, pp. 701-734, vol. 29.

Xu et al., "Surface charge and hydrophobicity determine ErbB2 binding to the Hsp90 chaperone complex", Nature Structural & Molecular Biology, Feb. 2005, pp. 120-126, vol. 12, No. 2.

Feng et al., "Nanoparticles of Biodegradable Polymers for Clinical Administration of Paclitaxel", Current Medicinal Chemistry, 2004, pp. 413-424, vol. 11.

Frazier et al., "Synthetic Aperture Techniques with a Virtual Source Element", IEEE Transactions on Ultrasonics, Ferroelectrics, and Frequency Control, Jan. 1998, pp. 196-207, vol. 45, No. 1.

Gammelmark et al., "Multielement Synthetic Transmit Aperture Imaging Using Temporal Encoding", IEEE Transactions on Medical Imaging, Apr. 2003, pp. 552-563, vol. 22, No. 4.

Gilbertson et al., "Dimensional crossover and weak localization in a 90 nm n-GaAs thin film", Applied Physics Letters, 2009, pp. 012113, vol. 95.

Giraev et al., "Fluorescent-Spectroscopic Research of In Vivo Tissues Pathological Conditions", International Journal of Modern Physics, 2004, pp. 899-910, vol. 18.

Grattarola et al., "Cell adhesion to silicon substrata: characterization by means of optical and acoustic cytometric techniques", Biomaterials, Jan. 1988, pp. 101-106, vol. 9.

Gupta et al., "Cellular uptake, localization and photodynamic effects of haematoporphyrin derivative in human glioma and squamous carcinoma cell lines", Journal of Photochemistry and Photobiology B: Biology, 2003, pp. 107-120, vol. 69.

Hafsteinsson et al., "Acoustic Microscopy—Principles and Applications in the Studies of Biomaterial Microstructure", Scanning Electron Microscopy, 1984, pp. 1237-1247, Part 3.

Hage et al., "Using the laser-induced fluorescence spectroscopy in the differentiation between normal and neoplastic human breast tissue", Lasers in Medical Science, 2003, pp. 171-176, vol. 18.

Hamblin et al., "Effect of Charge on the Interaction of Site-specific Photoimmunoconjugates with Human Ovarian Cancer Cells", Cancer Research, Nov. 1996, pp. 5205-5210, vol. 56.

Hays et al., "Hot-Electron Spectroscopy of GaAs", Physical Review Letters, 1985, pp. 1570-1572, vol. 54, No. 14.

He et al., "Electrostatic Modulation in Steroid Receptor Recruitment of LXXLL and FXXLF Motifs", Molecular and Cellular Biology, Mar. 2003, pp. 2135-2150, vol. 23, No. 6.

Hein et al., "A comparative study of the application of scanning acoustic microscopy and confocal laser scanning microscopy to the structural assessment of human bones", Annals of Anatomy, 1995, pp. 427-430, vol. 177.

Heiserman et al., "Acoustic Microscopy in Biophysics", Advances in Biological and Medical Physics, 1980, pp. 325-364, vol. 17.

Hildebrand et al., "Acoustic microscopy of living cells", Proceedings of the National Acedemy of Sciences of the United States of America, Mar. 1981, pp. 1656-1660, vol. 78, No. 3.

Hitomi et al., "A New Approach for Glomerular Lesions: Evaluation of Scanning Acoustic Microscopy (SAM) for Experimental Glomerular Disease in Rats", Ultrasound in Medicine & Biology, 2000, pp. 571-577, vol. 26, No. 4.

Hsu et al., "A Far-red Fluorescent Contrast Agent to Image Epidermal Growth Factor Receptor Expression", Photochemistry and Photobiology, 2004, pp. 272-279, vol. 79, No. 3.

Huang et al., "Laser-induced autofluorescence microscopy of normal and tumor human colonic tissue", International Journal of Oncology, 2004, pp. 59-63, vol. 24.

Hug et al., "Effect of Diethylaminoethyl-dextran on Colony Formation of Human Tumor Cells in Semisolid Suspension Cultures", Cancer Research, Jan. 1983, pp. 210-213, vol. 43.

Hughes, "Analysis of digitized waveforms using Shannon entropy", Journal of the Acoustical Society of America, Feb. 1993, pp. 892-906, vol. 93, No. 2.

Hughes, "Analysis of digitized waveforms using Shannon entropy. II. High-speed algorithms based on Green's functions", Journal of the Acoustical Society of America, May 1994, pp. 2582-2588, vol. 95(5).

Hughes, "Analysis of Ultrasonic Waveforms Using Shannon Entropy", IEEE Ultrasonics Symposium, 1992, pp. 1205-1209.

International Preliminary Report on Patentability (Chapter I) for PCT/US2007/074864 dated Apr. 9, 2009.

International Search Report and Written Opinion for PCT/US2007/074864 dated Jul. 25, 2008.

Israel et al., "Cell wall appositions and plant disease resistance: Acoustic microscopy of papillae that block fungal ingress", Proceedings of the National Academy of Sciences of the United States of America, Apr. 1980, pp. 2046-2049, vol. 77, No. 4.

Jankowiak et al., "Role of Fluorescence Line-Narrowing Spectroscopy and Related Luminescence-Based Techniques in the Elucidation of Mechanisms of Tumor Initiation by Polycyclic Aromatic Hydrocarbons and Estrogens", Journal of Physical Chemistry B, 2004, pp. 10266-10283, vol. 108.

Johnston et al., "Acoustic microscopy: Resolution of subcellular detail", Proceedings of the National Academy of Science of the United States of America, Jul. 1979, pp. 3325-3329, vol. 76, No. 7.

Jorgensen et al., "Small Intestine Wall Distribution of Elastic Stiffness Measured With 500 MHz Scanning Acoustic Microscopy", Annals of Biomedical Engineering, 2001, pp. 1059-1063, vol. 29.

Kallinteri et al., "Arsenic Trioxide Liposomes: Encapsulation Efficiency and In Vitro Stability", Journal of Liposome Research, 2004, pp. 27-38, vol. 14, Nos. 1 & 2.

Kameyama et al., "Evaluation of elastic structural change in coronary atherosclerosis using scanning acoustic microscopy", Atherosclerosis, 1992, pp. 191-200, vol. 94.

Kandela et al., "Effect of the lipophilic/hydrophilic character of cationic triarylmethane dyes on their selective phototoxicity toward tumor cells", Biotechnic & Histochemistry, 2003, pp. 157-169, vol. 78, No. 3-4.

Kang et al., "Dose-dependent regulation of superoxide anion on the proliferation, differentiation, apoptosis and necrosis of human hepatoma cells: the role of intracellular Ca2+", Redox Report, 2004, pp. 37-48, vol. 9, No. 1.

Karl et al., "Cell Contraction Caused by Microtubule Disruption Is Accompanied by Shape Changes and an Increased Elasticity Measured by Scanning Acoustic Microscopy", Cell Biochemistry and Biophysics, 1998, pp. 225-241, vol. 29.

Karl et al., "Tension Modulates Cell Surface Motility: A Scanning Acoustic Microscopy Study", Cell Motility and the Cytoskeleton, 1999, pp. 349-359, vol. 43.

Katz et al., "Micromechanics of the Dentin/Adhesive Interface", Journal of Biomedical Materials Research, 2001, pp. 366-371.

Katz et al., "Scanning Acoustic Microscope Studies of the Elastic Properties of Osteons and Osteon Lamellae", Journal of Biomechanical Engineering, Nov. 1993, pp. 543-548, vol. 115.

Katz et al., "Scanning Acoustic Microscopy of Human and Canine Cortical Bone Microstructure at High Frequencies", Studies in Health Technology and Informatics, 1997, pp. 123-137, vol. 40.

Kim et al. "Development of polymeric nanoparticulate drug delivery systems: evaluation of nanoparticles based on biotinylated poly(ethylene glycol) with sugar moiety", International Journal of Pharmaceutics, 2003, pp. 195-203, vol. 257.

Kino et al., "Fundamentals of Scanning Systems", Scanned Image Microscopy, New York, Academic Press Inc.; 1980, pp. 1-21.

Kinoshita et al., "Evaluation of Acoustic Properties of the Live Human Smooth-Muscle Cell Using Scanning Acoustic Microscopy", Ultrasound in Medicine & Biology, 1998, pp. 1397-1405, vol. 24, No. 9.

Kirkpatrick et al., "Endogenous Fluorescence Spectroscopy of Cell Suspensions for Chemopreventive Drug Monitoring", Photochemistry and Photobiology, 2005, pp. 125-134, vol. 81.

Kobayashi et al., "Spectroscopic Imaging and the Characterization of the Autofluorescence Properties of Human Bronchus Tissues Using UV Laser Diodes", IEEE Journal of Selected Topics in Quantum Electronics, Mar./Apr. 2003, pp. 142-147, vol. 9, No. 2.

Kolodziejczyk et al., "Transmission acoustic microscopy of tissue sections (1 GHz). Histoacoustics and acoustic staining." Histochemistry, 1988, pp. 165-169, vol. 88.

Kostarelos et al., "Binding and Interstitial Penetration of Liposomes Within Avascular Tumor Spheroids", International Journal of Cancer, 2004, pp. 713-721, vol. 112.

Krasnici et al., "Effect of the Surface Charge of Liposomes on Their Uptake by Angiogenic Tumor Vessels", International Journal of Cancer, 2003, pp. 561-567, vol. 105.

Krishna et al., "Micro-Raman Spectroscopy for Optical Pathology of Oral Squamous Cell Carcinoma", Applied Spectroscopy, 2004, pp. 1128-1135, vol. 58, No. 9.

Kurachi et al., "Optical Biopsy for Detection of Chemical-Induced Tongue Lesions in Golden Syrian Hamsters: An in vivo Study", Laser Physics, 2004, pp. 502-506, vol. 14, No. 4.

Lamarque et al., "Acoustic Microscopy: A New Tool for Ultrasonic Breast Tissue Characterization", Europ. J. Radiol., 1983, pp. 221-222, vol. 3.

Lambert, "Diagnosis of Esophagogastric Tumors", Endoscopy, 2004, pp. 110-119, vol. 36.

Laochariyakul et al., "Functional study of intracellular P-gp- and MRP1-mediated pumping of free cytosolic pirarubicin into acidic organelles in intrinsic resistant SiHa cells", Canadian Journal of Physiology and Pharmacology, 2003, pp. 790-799, vol. 81.

Xu et al., "The Effect of Asymmetric Surface Potentials on the Intramembrane Electric Field Measured with Voltage-Sensitive Dyes", Biophysical Journal, Apr. 2003, pp. 2768-2780, vol. 84.

Ylitalo et al., "Ultrasound Synthetic Aperture Imaging: Monostatic Approach", IEEE Transaction on Ultrasonics, Ferroelectrics, and Frequency Control, May 1994, pp. 333-339, vol. 41, No. 3.

Zawadzki, "Electron transport phenomena in small-gap semiconductors", Advances in Physics, 1974, pp. 435-522, vol. 23.

Zheng et al., Effects of ascorbic acid and sodium selenite on growth and redifferentiation in human hepatoma cells and its mechanisms, Pharmazie, 2002, pp. 265-269, vol. 57.

Zhou et al., "Extraordinary Magnetoresistance in Externally Shunted van der Pauw Plates", Applied Physics Letters, 2001, pp. 667-669, vol. 78, No. 5.

Zoller et al., "Cellular motility in vitro as revealed by scanning acoustic microscopy depends on cell-cell contacts", Cell & Tissue Research, 1997, pp. 43-50, vol. 290.

International Preliminary Report on Patentability (Chapter I) for PCT/US2011/020545 issued Jul. 19, 2012.

Larson, "An Acoustic Transducer Array for Medical Imaging—Part I", Hewlett-Packard Journal, Oct. 1983, pp. 17-22, vol. 34.

Law et al., "Nanoribbon Waveguides for Subwavelength Photonics Integration", Science, 2004, pp. 1269-1273, vol. 305.

Le at al., "Plant-derived 3,3'-Diindolylmethane Is a Strong Androgen Antagonist in Human Prostate Cancer Cells", The Journal of Biological Chemistry, Jun. 2003, pp. 21136-21145, vol. 278, No. 23.

Lemons et al. "Acoustic Microscopy: Biomedical Applications", Science, May 1975, pp. 905-911, vol. 188, No. 4191.

Levinson, "Phase Detection in Acoustic Microscopy", Ultrasonic Imaging, 1990, pp. 292-308, vol. 12.

Li et al., "Improved Synthetic Aperture Focusing Technique with Applications in High-Frequency Ultrasound Imaging", IEEE Transactions on Ultrasonics, Ferroelectrics, and Frequency Control, Jan. 2004, pp. 63-70, vol. 51, No. 1.

Linker et al., "Autocorrelation Length of Normal and Myopathic Human Myocardium Measured by Acoustic Microscopy: Implications for Clinical Ultrasonic Tissue Characterization", Ultrasound in Medicine & Biology, 1990, pp. 793-799, vol. 16, No. 8.

Litniewski et al., "Measurements of cells in culture by scanning acoustic microscopy", Journal of Microscopy, Apr. 1990, pp. 95-107, vol. 158, Pt. 1.

Liu et al., "Synthesis and Cellular Studies of Nonaggregated Water-Soluble Phthalocyanines", Journal of Medicinal Chemistry, 2005, pp. 1033-1041, vol. 48.

Lovejoy et al., "Temperature dependence of minority and majority carrier mobilities in degenerately doped GaAs", Applied Physics Letters, Aug. 1995, pp. 1101-1103, vol. 67, No. 8.

Lu et al., "Evaluation of Progression in Nonrheumatic Aortic Valvular Stenosis by Scanning Acoustic Microscopy", Ultrasound in Medicine & Biology, 2000, pp. 563-569, vol. 26, No. 4.

Luers et al., "Acoustic Microscopy of Cultured Cells. Distribution of Forces and Cytoskeletal Elements", Cell Biophysics, 1991, pp. 279-293, vol. 18, Issue 3.

Macrae, "Rays of Hope. Spectroscopy as an Emerging Tool for Cancer Diagnostics and Monitoring", Spectroscopy, 2003, pp. 14-19, vol. 18.

Madhuri et al., "Native Fluorescence Spectroscopy of Blood Plasma in the Characterization of Oral Malignancy", Photochemistry and Photobiology, 2003, pp. 197-204, vol. 78, No. 2.

Manjunath et al., "Autofluorescence of oral tissue for optical pathology in oral malignancy", Journal of Photochemistry and Photobiology B: Biology, 2004, pp. 49-58, vol. 73.

Mark et al., "Fourier transform infrared microspectroscopy as a quantitative diagnostic tool for assignment of premalignancy grading in cervical neoplasia", Journal of Biomedical Optics, May/Jun. 2004, pp. 558-567, vol. 9, No. 3.

Markowitz et al., "Identification and Characterization of Small Molecule Inhibitors of the Calcium-Dependent S100B—p53 Tumor Suppressor Interaction", Journal of Medicinal Chemistry, 2004, pp. 5085-5093, vol. 47.

Marquez et al., "Charge-dependent Targeting: Results in Six Tumor Cell Lines", Anticancer Research, 2004, pp. 1347-1351, vol. 24.

Marquez et al., "Development of Dextran Derivatives with Cytotoxic Effects in Human Urinary Bladder Cancer Cell Lines", Anticancer Research, 2002, pp. 741-744, vol. 22.

Masilamani et al., "Cancer diagnosis by autofluorescence of blood components", Journal of Luminescence, 2004, pp. 143-154, vol. 109.

Masugata et al., "Evaluation of Left Atrial Wall Elasticity Using Acoustic Microscopy", Angiology, Jul. 1999, pp. 583-590, vol. 50, No. 7.

Masugata et al., "Relationship Between Myocardial Tissue Density Measured by Microgravimetry and Sound Speed Measured by Acoustic Microscopy", Ultrasound in Medicine & Biology, 1999, pp. 1459-1463, vol. 25, No. 9.

Masugata et al., "Tissue Characterization of Myocardial Cells by Use of High-Frequency Acoustic Microscopy: Differential Myocyte Sound Speed and Its Transmural Variation in Normal, Pressure-Overload Hypertrophic, and Amyloid Myocardium", Angiology, Oct. 1999, pp. 837-845, vol. 50, No. 10.

Mayinger et al., "Evaluation of Endoscopic Fluorescence Spectroscopy for Gastric Cancer", Gastroenterology, 2003, pp. A185-A185, vol. 124.

Mayinger et al., "Influence of Collagen in Endoscopic Fluorescence Spectroscopy for Gastric Cancer", Gastrointestinal Endoscopy, 2004, p. P172, vol. 59, No. 5.

McPherson, "Tissue Characterization by Ultrasound: What is Possible Now? What Will be Possible?" Echocardiography, 1991, pp. 77-91, vol. 8, No. 1.

Mercer et al., "Metastatic breast cancer cells suppress osteoblast adhesion and differentiation", Clinical & Experimental Metastasis, 2004, pp. 427-435, vol. 21.

Miller et al., "The Determination of Very Small Electrophoretic Mobilities in Polar and Nonpolar Colloidal Dispersions Using Phase Analysis Light Scattering", Journal of Colloid and Interface Science, May 1991, pp. 532-554, vol. 143, No. 2.

Miller, "An Acoustic Transducer Array for Medical Imaging—Part II", Hewlett-Packard Journal, Oct. 1983, pp. 22-26.

Mizutani et al., "Evaluation of Acetic Acid-Induced Gastric Ulcers in Rats by Scanning Acoustic Microscopy", Scand J Gastroenterol, 1991, pp. 313-320, vol. 26.

Monici et al., "Dependence of leukemic cell autofluorescence patterns on the degree of differentiation", Photochemical & Photobiological Sciences, 2003, pp. 981-987, vol. 2.

Moussa et al., "Finite Element Modeling of Extraordinary Magnetoresistance in Thin Film Semiconductors with Metallic Inclusions", Physical Review B (Condensed Matter and Materials Physics), 2001, pp. 184410/1-184410/8, vol. 64.

Moxnes et al., "The dynamics of cell proliferation", Medical Hypotheses, 2004, pp. 556-563, vol. 62.

Muller et al. "Spectroscopic Detection and Evaluation of Morphologic and Biochemical Changes in Early Human Oral Carcinoma", Cancer, Apr. 2003, pp. 1681-1692, vol. 97, No. 7.

Munoz-Martinez et al., "Celastraceae Sesquiterpenes as a New Class of Modulators That Bind Specifically to Human P-Glycoprotein and Reverse Cellular Multidrug Resistance", Cancer Research, Oct. 2004, pp. 7130-7138, vol. 64.

Nadeau et al., "In vivo measurement of 5-aminolaevulinic acid-induced protoporphyrin IX photobleaching: a comparison of red and blue light of various intensities", Photodermatology Photoimmunology & Photomedicine, 2004, pp. 170-174, vol. 20.

Nakanishi et al., "Photoconductance and inverse photoconductance in films of functionalized metal nanoparticles", Nature, Jul. 2009, 371-375, vol. 460.

Neild et al., "Images of arterioles in unfixed tissue obtained by acoustic microscopy", Journal of Microscopy, Jul. 1985, pp. 19-25, vol. 139.

Newaz et al., "A nanoscale Ti/GaAs metal-semiconductor hybrid sensor for room temperature light detection", Applied Physics Letters, 2010, pp. 082105/1-3, vol. 97.

Newaz et al., "Transport measurements and analytical modeling of extraordinary electrical conductance in Ti-GaAs metal-semiconductor hybrid structures", Physical Review B, 2009, pp, 195308, vol. 79.

Nomura et al., "Micromechanics/structure relationships in the human mandible", Dental Materials, 2003, pp. 167-173, vol. 19.

Office Action for EP Application 07874412.5 dated Jun. 9, 2010.

Office Action for EP Application 09010537.0 dated Nov. 15, 2010.

Ogawa et al., "Effect of Replacing the Aspartic Acid/Glutamic Acid Residues of Bullfrog Sialic Acid Binding Lectin with Asparagine/Glutamine and Arginine on the Inhibition of Cell Proliferation in Murine Leukemia P388 Cells", Biol. Pharm. Bull., 2002, pp. 722-727, vol. 25, No. 6.

Ortner et al., "Time gated fluorescence spectroscopy in Barrett's oesophagus", Gut, 2003, pp. 28-33, vol. 52.

Palevski et al., "Lateral Tunneling, Ballistic Transport, and Spectroscopy in a Two-Dimensional Electron Gas", Physical Review Letters, 1989, pp. 1776-1779, vol. 62, No. 15.

Palmer et al., "Autofluorescence Spectroscopy of Normal and Malignant Human Breast Cell Lines", Photochemistry and Photobiology, 2003, pp. 462-469, vol. 78, No. 5.

Palmer et al., "Comparison of Multiexcitation Fluorescence and Diffuse Reflectance Spectroscopy for the Diagnosis of Breast Cancer (Mar. 2003)", IEEE Transactions of Biomedical Engineering, Nov. 2003, pp. 1233-1242, vol. 50, No. 11.

Panjehpour et al., "Laser-Induced Fluorescence Spectroscopy for In Vivo Diagnosis of Non-melanoma Skin Cancers", Lasers in Surgery and Medicine, 2002, pp. 367-373, vol. 31.

Panyam et al., "Rapid endo-lysosomal escape of poly(DL-lactide-co-glycolide) nanoparticles: implications for drug and gene delivery", The FASEB Journal, Aug. 2002, pp. 1217-1226, vol. 16.

A'Amar et al., "Comparison between ultraviolet-visible and near-infrared elastic scattering spectroscopy of chemically induced melanomas in an animal model", Journal of Biomedical Optics, Nov./Dec. 2004, pp. 1320-1326, vol. 9(6).

Abnet et al., "Zinc Concentration in Esophageal Biopsy Specimens Measured by X-Ray Fluorescence and Esophageal Cancer Risk", Journal of National Cancer Institute, Feb. 2005, pp. 301-306, vol. 97, No. 4.

Agasoster et al., "The Interaction of Peripheral Proteins and Membranes Studied with a-Lactalbumin and Phospholipid Bilayers of Various Compositions", Journal of Biological Chemistry, Jun. 2003, pp. 21790-21797, vol. 278, No. 24.

Andersen et al., "A new method to correlate histology with biomechanical properties in urethral tissue. An in-vitro study using light microscopy and scanning acoustic microscopy", APMIS Supplement, 2003, pp. 35-38, vol. 109.

Anderson et al. "Mechanism of Binding and Internalization of ICAM-1-Derived Cyclic Peptides by LFA-1 on the Surface of T Cells: A Potential Method for Targeted Drug Delivery", Pharmaceutical Research, Oct. 2003, pp. 1523-1532, vol. 20.

Anderson et al., "Fluorescence spectroscopy accurately detects irreversible cell damage during hepatic radiofrequency ablation", Surgery, 2004, pp. 524-531, vol. 136, No. 3.

Arnberg et al., "Adenovirus Type 37 Binds to Cell Surface Sialic Acid Through a Charge-Dependent Interaction", Virology, 2002, pp. 33-43, vol. 302.

Baker et al., "The Mathematical Theory of Huygens' Principle", Nature, Apr. 1940, pp. 531-532, vol. 145.

Barr et al., "Scanning Acoustic Microscopy of Neoplastic and Inflammatory Cutaneous Tissue Specimens", The Journal of Investigative Dermatology, Jan. 1991, pp. 38-42, vol. 96, No. 1.

Bayer et al., "Structural Analysis of the Mitotic Regulator hPin1 in Solution—Insights into domain architecture and substrate binding", Journal of Biological Chemistry, Jul. 2003, pp. 26183-26193, vol. 278, No. 28.

Belyaeva et al., "Laser Fluorescence Specroscopy with 5-Aminolevulinic Acid in Operative Gynecology", Laser Physics, 2004, pp. 1207-1213, vol. 14, No. 9.

Bereiter-Hahn et al., "Mechanical basis of cell shape: investigations with the scanning acoustic microscope", Biochemistry Cell Biology, 1995, pp. 337-348, vol. 73.

Bereiter-Hahn, "Architecture of Tissue Cells. The Structural Basis Which Determines Shape and Locomotion of Cells", Acta Biotheoretica, 1985, pp. 139-148, vol. 34.

Bereiter-Hahn, "Scanning acoustic microscopy visualizes cytomechanical responses to cytochalasin D", Journal of Microscopy-Oxford, Apr. 1987, pp. 29-39, vol. 146.

Bigio et al., "Spectroscopic Sensing of Cancer and Cancer Therapy—Current Status of Translational Research", Cancer Biology & Therapy, Mar. 2004, pp. 259-267, vol. 3:3.

Bocsi et al., "Scanning Fluorescent Microscopy Analysis Is Applicable for Absolute and Relative Cell Frequency Determinations", Cytometry, 2004, pp. 1-8, vol. 61A.

Boone et al., "Bone attachment to hydroxyapatite coated polymers", Journal of Biomedical Materials Research, 1989, pp. 183-199, vol. 23.

Bornhop et al., "Luminescent Lanthanide Chelate Contrast Agents and Detection of Lesions in the Hamster Oral Cancer Model", Applied Spectroscopy, 2003, pp. 1216-1222, vol. 57, No. 10.

Branford et al., "Geometric Manipulation of the High-Field Linear Magnetoresistance in InSb Epilayers on GaAs (001)", Applied Physics Letters, 2005, pp. 202116/1-202116/3, vol. 86.

Breslin et al., "Autofluorescence and Diffuse Reflectance Properties of Malignant and Benigh Breast Tissues", Annals of Surgical Oncology, 2003, pp. 65-70, vol. 11, No. 1.

Brewer et al., "Imaging of the Ovary", Technology in Cancer Research & Treatment, Dec. 2004, pp. 617-627, vol. 3, No. 6.

Brewer et al., "Prevention of Ovarian Cancer: Intraepithelial Neoplasia", Clinical Cancer Research, Jan. 2003, pp. 20-30, vol. 9.

Briggs et al., "Quantitative acoustic microscopy of individual living human cells", Journal of Microscopy, Oct. 1993, pp. 3-12, vol. 172.

Bumrerraj et al., "Scanning Acoustic Microscopy Study of Human Cortical and Trabecular Bone", Annals of Biomedical Engineering, 2001, pp. 1034-1042, vol. 29.

Buttemere et al., "In vivo assessment of thermal damage in the liver using optical spectroscopy", Journal of Biomedical Optics, Sep./Oct. 2004, pp. 1018-1027, vol. 9, No. 5.

Carrasco et al., "Design of a Composite Ethidium—Netropsin—Anilinoacridine Molecule for DNA Recognition", Chembiochem, 2003, pp. 50-61, vol. 4.

Celentano et al., "Preliminary Tests of a Prototype System for Optical and Radionuclide Imaging in Small Animals", IEEE Transactions on Nuclear Science, Oct. 2003, pp. 1693-1701, vol. 50, No. 5.

Chandraratna et al., "Visualization of myocardial cellular architecture using acoustic microscopy", American Heart Journal, Nov. 1992, pp. 1358-1364, vol. 124, No. 5.

Chandrasekharan et al., "Non-resonant Multiphoton Photoacoustic Spectroscopy for Noninvasive Subsurface Chemical Diagnostics", Applied Spectroscopy, 2004, pp. 1325-1333, vol. 58, No. 11.

Chang et al., "Analytical model to describe fluorescence spectra of normal and preneoplastic epithelial tissue: comparison with Monte Carlo simulations and clinical measurements", Journal of Biomedical Optics, May/Jun. 2004, pp. 511-522, vol. 9, No. 3.

Chawla et al., "Biodegradable poly(e-caprolactone) nanoparticles for tumor-targeted delivery of tamoxifen", International Journal of Pharmaceutics, 2002, pp. 127-138, vol. 249.

Chen et al., "Auto-fluorescence spectra of oral submucous fibrosis", Journal of Oral Pathology & Medicine, 2003, pp. 337-343, vol. 32.

Chen, "Introduction to Scanning Tunneling Microscopy", Second Edition, 2008, pp. 23-40, Oxford University Press.

Ciarlet et al., "Differential Infection of Polarized Epithelial Cell Lines by Sialic Acid-Dependent and Sialic Acid-Independent Rotavirus Strains", Journal of Virology, Dec. 2001, pp. 11834-11850, vol. 75, No. 23.

Clark et al., "Detection and diagnosis of oral neoplasia with an optical coherence microscope", Journal of Biomedical Optics, Nov./Dec. 2004, pp. 1271-1280, vol. 9, No. 6.

Collier et al., "Determination of Epithelial Tissue Scattering Coefficient Using Confocal Microscopy", IEEE Journal of Selected Topics in Quantum Electronics, Mar./Apr. 2003, pp. 307-313, vol. 9, No. 2.

Crowder et al., "First Experience With Noncavitational Ultrasound Enhancement of Selective Cellular Delivery of Liquid Perfluorocarbon Nanoparticles to Angiogenic Sites", Journal of the American College of Cardiology, Mar. 2003, p. 59A, vol. 41.

Cunderlikova et al., "Electrostatic Properties of Cells Estimated by Absorption and Fluorescence Spectroscopy", Cell Biochemistry and Biophysics, 2004, pp. 1-10, vol. 41.

De Alberquerque et al., "Differential Expression of Sialic Acid and N-acetylgalactosamine Residues on the Cell Surface of Intestinal Epithelial Cells According to Normal or Metastatic Potential", Journal of Histochemistry & Cytochemistry, 2004, pp. 629-640, vol. 52, No. 5.

De Veld et al., "Autofluorescence Characteristics of Healthy Oral Mucosa at Different Anatomical Sites", Lasers in Surgery and Medicine, 2003, pp. 367-376, vol. 32.

Drezek et al., "Optical Imaging of the Cervix", Cancer, Nov. 2003, pp. 2015-2027, vol. 98, No. 9.

Eckardt et al., "Quantitative Measurements of the Mechanical Properties of Human Bone Tissues by Scanning Acoustic Microscopy", Annals of Biomedical Engineering, 2001, pp. 1043-1047, vol. 29.

Errington et al., "Advanced microscopy solutions for monitoring the kinetics and dynamics of drug-DNA targeting in living cells", Advanced Drug Delivery Reviews, 2005, pp. 153-167, vol. 57.

Extended European Search Report for EP Application No. 07874412.5 dated Mar. 2, 2010.

Extended European Search Report for EP Application No. 09010537.0 dated Apr. 8, 2010.

Fantin et al., "A novel mitochondriotoxic small molecule that selectively inhibits tumor cell growth", Cancer Cell, Jul. 2002, pp. 29-42, vol. 2.

Farokhzad et al., "Nanoparticle-Aptamer Bioconjugates: A New Approach for Targeting Prostate Cancer Cells", Cancer Research, Nov. 2004, pp. 7668-7672, vol. 64.

Fasolini et al., "Hot Spots in Tcf4 for the Interaction with b-Catenin", The Journal of Biological Chemistry, Jun. 2003, pp. 21092-21098, vol. 278, No. 23.

Feingold et al., "Enhancement by Retinoic Acid of the Sensitivity of Different Tumor Cell Lines to the Sialic Acid-Specific Toxin of Entamoeba Histolytica", Cancer Letters, 1984, pp. 263-271, vol. 24.

Intention to Grant for EP07874412.5 dated Aug. 20, 2012.

* cited by examiner

METHOD AND APPARATUS FOR HIGH RESOLUTION PHOTON DETECTION BASED ON EXTRAORDINARY OPTOCONDUCTANCE (EOC) EFFECTS

CROSS-REFERENCE AND PRIORITY CLAIM TO RELATED PATENT APPLICATIONS

This patent application claims priority to U.S. provisional patent application Ser. No. 61/293,442; filed Jan. 8, 2010, the entire disclosure of which is incorporated herein by reference.

This patent application is related to pending U.S. patent application Ser. No. 12/375,861, filed Jan. 30, 2009, which is a U.S. national phase entry of PCT patent application PCT/US07/74864, filed Jul. 31, 2007, which claims priority to U.S. provisional patent application 60/821,040, filed Aug. 1, 2006, the entire disclosures of each of which are incorporated herein by reference.

BACKGROUND AND SUMMARY OF THE INVENTION

Extraordinary optoconductance (EOC) is a recent example of a class of geometry-driven interfacial "EXX" phenomena exhibited by metal-semiconductor hybrid (MSH) structures, wherein:

E=extraordinary; and

XX=a type of interfacial phenomena such as magnetoresistance (MR), piezoconductance (PC), optoconductance (OC) and electroconductance (EC).

See the above-referenced and incorporated related patent applications; see also Wieland et al., "Extraordinary optoconductance in metal-semiconductor hybrid structures", Appl. Phys. Lett. 88, 052105 (2006); Solin et al., "Enhanced Room-Temperature Geometric Magnetoresistance in Inhomogeneous Narrow-Gap Semiconductors", Science 289, 1530 (2000); Rowe et al., "Enhanced Room-Temperature Piezoconductance of Metal-Semiconductor Hybrid Structures", Appl. Phys. Lett. 83, 1160 (2003); Rowe et al., "Giant Room-Temperature Piezoresistance in a Metal-Silicon Hybrid Structure", Phys. Rev. Lett. 100, 145501 (2008); and Wang et al., "Extraordinary electroconductance in metal-semiconductor hybrid structures", Appl. Phys. Lett. 92, 262106 (2008), the entire disclosures of each of which is incorporated herein by reference. The term "EXX sensor" thus refers to a class of MSH devices having a semiconductor/metal interface whose response to a specific type of perturbation produces an extraordinary interfacial effect XX or an extraordinary bulk effect XX. The interfacial or bulk effect XX is said to be "extraordinary" as that would term would be understood in the art to mean a many-fold increase in sensitivity relative to that achieved with a macroscopic device for the same perturbation.

For example, the above-referenced and incorporated patent applications describe an EOC device such as the one depicted in FIG. 1. FIG. 1 illustrates an exemplary EOC sensor 100, which is an MSH device having a semiconductor portion 102 and a metal shunt portion 104 which are disposed on a substrate 106. Together, the semiconductor portion 102 and the metal shunt portion 104 define a semiconductor/metal interface 108. As shown in FIG. 1, with the EOC sensor of FIG. 1, the semiconductor portion 102 and the metal shunt portion 104 are substantially co-planar. Furthermore, the semiconductor portion 102 and the metal shunt portion 104 lie in a substantially parallel plane as the substrate 106. Further still, it can be seen that the semiconductor/metal interface 108 is substantially perpendicular to the plane of substrate 106. This architecture can be referred to as an externally shunted van der Pauw (vdP) plate.

In operation, the EOC device 100 is perturbed with light 102 from a light perturbation source 120 (which can be any source of light emissions, including but not limited to a laser emitting device, cells with fluorescent emissions (such as would be emitted with the introduction of a fluorine-based contrast agent), etc.). The light 122 which impacts the light exposed surfaces of the semiconductor portion 102 and metal shunt portion 104 results in the semiconductor-metal interface 108 behaving as an Ohmic (or linear) interface and produces a measurable voltage via an EOC effect. Experimentation with EOC devices 100 with the general architecture shown in FIG. 1 wherein the EOC devices have length (y-axis) and width (x-axis) dimensions of 500 nm or more have shown such EOC devices to exhibit an effective resistance that decreases with increased illumination intensity.

Another example of an EXX sensor described in the above-referenced and incorporated patent applications is the EEC device 200 depicted in FIG. 2. The EEC sensor 200 of FIG. 2 is also an MSH device comprising a semiconductor portion 202 and a metal shunt portion 204. With the EEC device 200 of FIG. 2, the metal shunt portion 204 is disposed on a surface of the semiconductor portion 202, and the semiconductor portion 202 is disposed on a surface of substrate 206 such that the semiconductor portion 202 is sandwiched between the metal shunt portion 204 and the substrate 206. As shown in FIG. 2, the metal shunt portion 204, the semiconductor portion 202, and the substrate portion 206 preferably lie in substantially parallel planes. Together, the contact between the metal shunt portion 204 and the semiconductor portion 206 define a semiconductor/metal interface 208. Thus, unlike the EOC device 100 of FIG. 1, the plane of the semiconductor/metal interface 208 of EEC device 200 is substantially parallel with the plane of the metal shunt/semiconductor/substrate. In operation, an electric charge created by an external electric field perturbs the EEC device to produce a voltage response via an EEC effect.

Panel (a) of FIG. 3 shows a perspective schematic view of an exemplary EEC van der Pauw structure upon which experiments have been conducted. The metal shunt portion (with a 50 μm radius) is concentric and in direct contact with the semiconductor portion (a GaAs mesa with a radius of 100 μm). Four leads are deposited on the periphery of the mesa surface and lead 5 is directly connected to the metal shunt. Panel (b) of FIG. 3 shows an SEM image of such a device but without the metal shunt on top. Panel (c) of FIG. 3 shows a cross-sectional view of the EEC's multilayer structure. As can be seen, the metal shunt comprises two 50 nm thick metal thin films Ti and Au/Ge. The inventors note that multiple layers of metal can be used in the metal shunt portion 204 to promote adhesion. For example, Ti sticks well to GaAs, but Au/Ge is a better conductor. Thus, by using both Ti and Au/Ge in the metal shunt, the device can leverage both advantageous properties. Also, the semiconductor portion comprises an Si-doped GaAs epitaxial layer (200 nm thick) and an undoped GaAs epitaxial layer (0.8 μm thick). The undoped semiconductor layer was positioned on a substrate portion that comprises a semi-insulating GaAs substrate (350 μm thick). A pair of parallel plates (0.2 μm Au/Ge plates) is incorporated to apply an external electric field with a 1 μm $Si_3N_4$ dielectric between the top plate and the metal shunt. In experimenting with such an EEC device, the inventors serendipitously discovered that such an EEC device exhibited a very strong sensitivity to light. Further still, when reducing the scale of this device to a nanoscale, the inventors discovered not only a strong sensitivity to light but also a fundamentally different type of sensitivity to light than observed for the larger macroscopic EEC device. That is, the inventors discovered that a device having the architecture of the EEC devices of FIGS. 2 and 3 could also serve as an EOC device that produces an extraordinary response to light perturbations. Moreover, when the device dimensions were reduced to the nanoscale, the inventors unexpectedly discovered that the device exhibits an inverse and much larger EOC response (an "I-EOC" response) in which the effective resistance of the device increases with increasing illumination intensity (in contrast to observations in connection with devices having a macroscopic scale where the effective resistance decreased with increasing illumination intensity). As a result of experimentation and analysis, the inventors believe that by reducing the spacing between the Ohmic leads and the metal shunt to a value less than a maximum of around 10 times the mean free path of the carriers in the active semiconductor layer such an I-EOC effect becomes possible. The inventors further believe that reducing this spacing to values below 500 nm makes the I-EOC effect more pronounced. The inventors further believe that the spacing may become too little for an I-EOC effect when too many electrons begin to tunnel from the electrode to the shunt through the semiconductor. The inventors believe that this minimum threshold would be reached at a spacing of around 1-3 nm. Furthermore, the inventors discovered that this I-EOC effect is achieved in room temperature environments (i.e., around 300 K or 27° C.).

As used herein, "nanoscale" refers to dimensions of length, width (or diameter), and thickness for the semiconductor and metal portions of the EXX sensor that are not greater than approximately 1000 nanometers in at least one dimension. As used herein, "microscale" refers to dimensions of length, width (or diameter), and thickness for the semiconductor and metal portions of the EXX sensor that are not greater than approximately 1000 micrometers in at least one dimension.

The room temperature I-EOC effect exhibited by embodiments of the present invention is believed to be fundamentally distinct from the negative photoconductivity seen in laterally macroscopic semiconductor heterostructures or in functionalized nanoparticle films (see Nakanishi et al., "Photoconductance and inverse photoconductance in films of functionalized metal nanoparticles", Nature 460, 371 (2009)). For example, the inventors believe that the I-EOC effect exhibited by embodiments of the invention is not dependent on trap states but rather on a transition from ballistic to diffusive transport, as explained below. Moreover, although much work on nanowire-based nanophotonic devices have been reported, the inventors believe that such nanowire-based nanophotonic devices are not currently compatible with Very/Ultra Large Scale Integration (VLSU ULSI) fabrication methods. (See Law et al., "Nanoribbon Waveguides for Subwavelength Photonics Integration", Science 305, 1269 (2004)). By contrast, the I-EOC devices described herein are VLSI-compatible, individually-addressable, and exhibit significant sensitivity in the visible light spectrum. As such, the inventors believe that the I-EOC nanosensors described herein have beneficial applications in a wide variety of nanophotonic applications, ranging from medical imaging for diagnostics to information technology and communication. (See Law et al., "Nanoribbon Waveguides for Subwavelength Photonics Integration", Science 305, 1269 (2004)). For example, the EOC and I-EOC sensors described herein can be employed in applications including, but not limited to, contact imaging, astronomical detection and observation, video cameras, still cameras, cancer detection, blood analysis, nanoparticle diffusion and size studies in industrial processes, position-sensitive detection and optical information storage and detection. When used in connection with contact imaging, embodiments of the invention can be employed as described in the above-referenced and incorporated Ser. No. 12/375,861 application. For example, an object can be brought into proximity or contact with a dense array of EOC or I-EOC sensors described herein, light can be passed through the object, and voltage readings from the sensor leads can be used to generate pixels for images of the object. With applications to astronomical detection/observation, video cameras and still cameras, the EOC and I-EOC sensors disclosed herein can be used as an optical sensor akin to CCD devices (wherein each EOC/I-EOC sensor would effectively serve as a pixel sensor). For applications involving cancer analysis and detection, cancer analysis/detection might be accomplished by detecting fluorophores or other light emitting agents (bioluminescence, etc.) that bind to pathological molecules or are expressed by transformed or transfected cells, either in vivo or in vitro. For applications involving nanoparticle diffusion and size studies, the inventors note that a medium that contains the subject nanoparticles can be brought into proximity or contact with an array of EOC/I-EOC sensors described herein, and light can be passed through the medium to impact the array. The voltage readouts on the sensor leads can then be monitored for intensity distribution as a function of time. For position-sensitive detection applications, for example, the EOC/I-EOC sensors described herein can be used in a similar manner as described for nanoparticle diffusion, but a moving (micro or nano) flag (such as a hole attached to or in the object whose position it to be detected) is included. In an application relating to information storage, a single I-EOC sensor (or small number of such sensors) could be placed on a moving arm of an optical information storage system to detect reflected light from an optical disc.

Therefore, in accordance with an aspect of an embodiment of the present invention, the inventors herein disclose a method that comprises perturbing a nanoscale MSH device with light to produce an EOC effect. Preferably, this EOC effect is an I-EOC effect. Furthermore, the MSH device may comprise a semiconductor material, a metal shunt located on a surface of the semiconductor material, thereby defining a semiconductor/metal interface, wherein a portion of the semiconductor material surface is not covered by the metal shunt, wherein the semiconductor material and the metal shunt are in substantially parallel planes but are not co-planar, and wherein the semiconductor/metal interface is configured to exhibit a change in resistance in response to the light perturbation.

In accordance with another aspect of an embodiment of the present invention, the inventors herein disclose a method that comprises perturbing a nanoscale MSH device having a semiconductor/metal interface that defines a Schottky barrier (non-linear) interface with light to produce an I-EOC effect.

In accordance with yet another aspect of an embodiment of the present invention, the inventors herein disclose a method that comprises perturbing an MSH device with light to generate an EOC response, wherein carrier flow within the MSH device across the semiconductor-metal interface transitions from primarily a ballistic transport to a diffusive transport in response to the perturbation by the light.

Further still, in accordance with another aspect of an embodiment of the present invention, the inventors herein discloses a method that comprises perturbing an MSH device with both light and electric charge perturbations to produce an EEC and EOC response.

Furthermore, in accordance with yet another aspect of an embodiment of the present invention, the inventors herein disclose the combination of multiple I-EOC devices in an array such that an imaging device having pixels of nanoscale resolution is created. Such an array can be perturbed with electric charge and/or light to create images having a nanoscale resolution.

These and other features and advantages of the present invention will be described hereinafter to those having ordinary skill in the art.

DETAILED DESCRIPTION OF THE PREFERRED EMBODIMENTS

Figure 4:
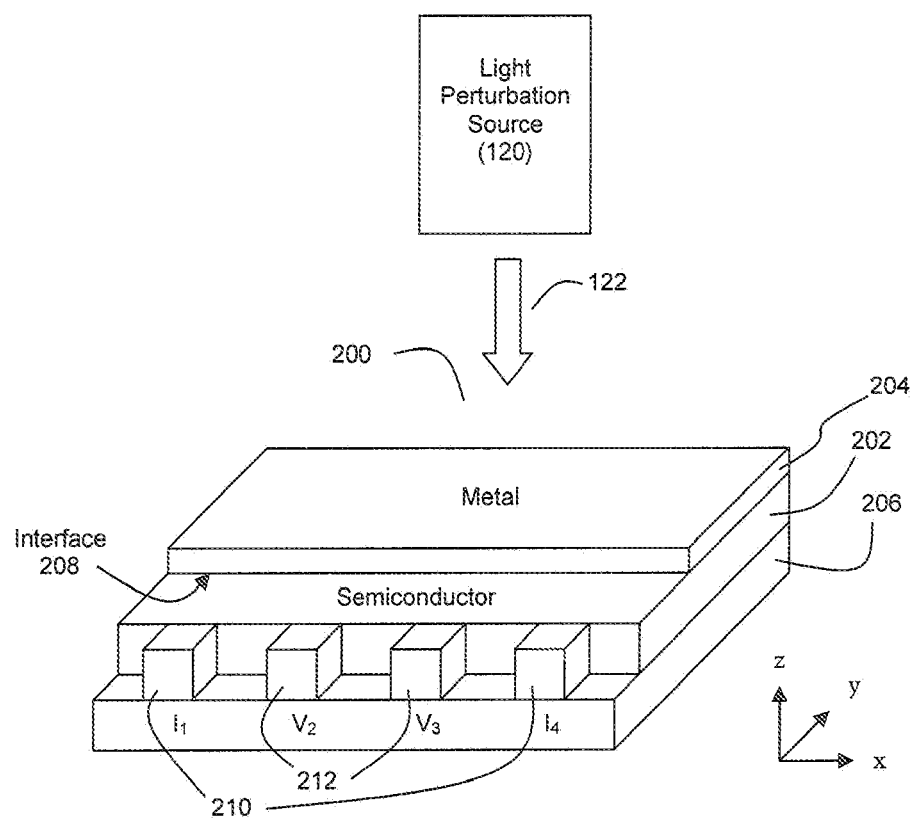
FIG. 4 depicts an exemplary EOC device in accordance with an embodiment of the present invention.

FIG. 4 depicts an exemplary MSH device 200 that can be employed as an EOC sensor in accordance with an embodiment of the present invention. As shown in FIG. 4, the EOC sensor 200 is an MSH device comprising several layers, including a semiconductor portion 202 and a metal shunt portion 204. The metal shunt portion 204 is disposed on a surface of the semiconductor portion 202, and the semiconductor portion 202 is disposed on a surface of substrate 206 such that the semiconductor portion 204 is sandwiched between the metal shunt portion 202 and the substrate 206. As shown in FIG. 4, the metal shunt portion 204, the semiconductor portion 202, and the substrate portion 206 preferably lie in substantially parallel planes. Together, the contact between the metal shunt portion 204 and the semiconductor portion 206 define a semiconductor/metal interface 208. Thus, unlike the EOC sensor architecture described in the related and above-referenced patent applications, the plane of the semiconductor/metal interface 208 of the EOC sensor shown in FIG. 4 is substantially parallel with the plane of the metal shunt/semiconductor/substrate.

Figure 5:
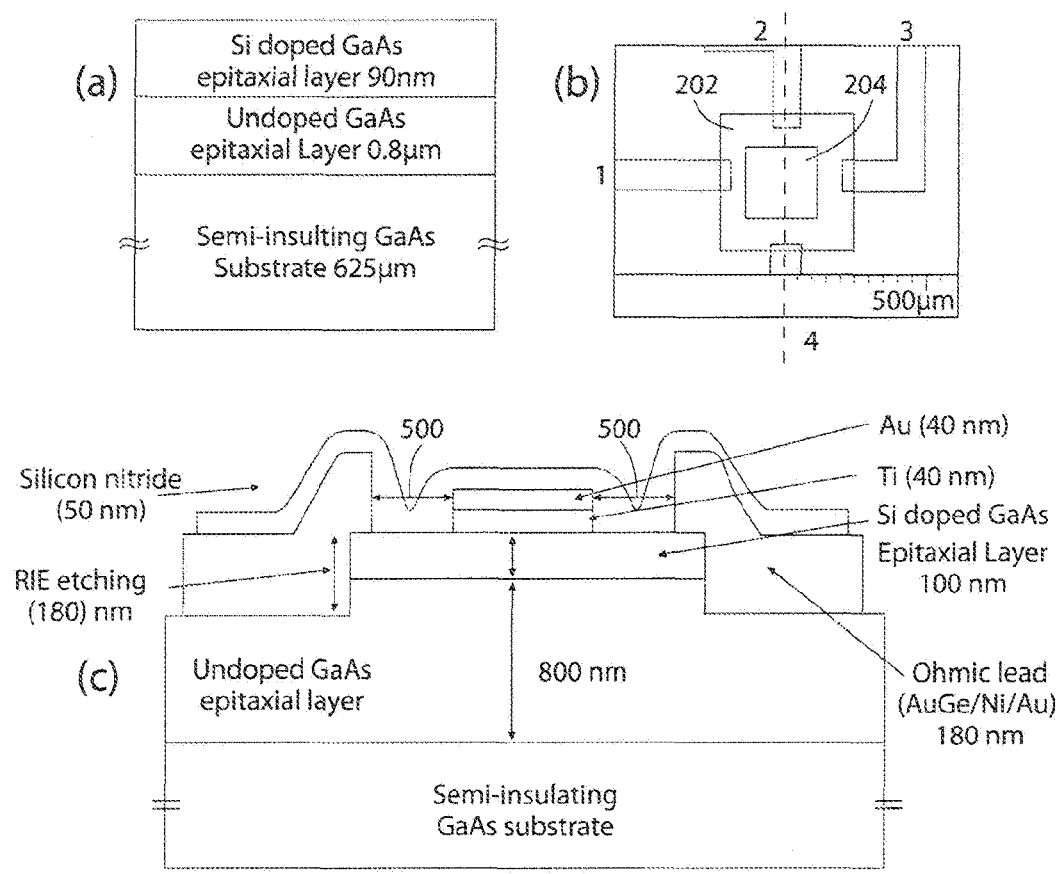
FIG. 5 depicts a shuntless semiconductor device (panel (a)) and an exemplary EOC device in accordance with an embodiment of the present invention (panels (b) and (c))
Figure 8:
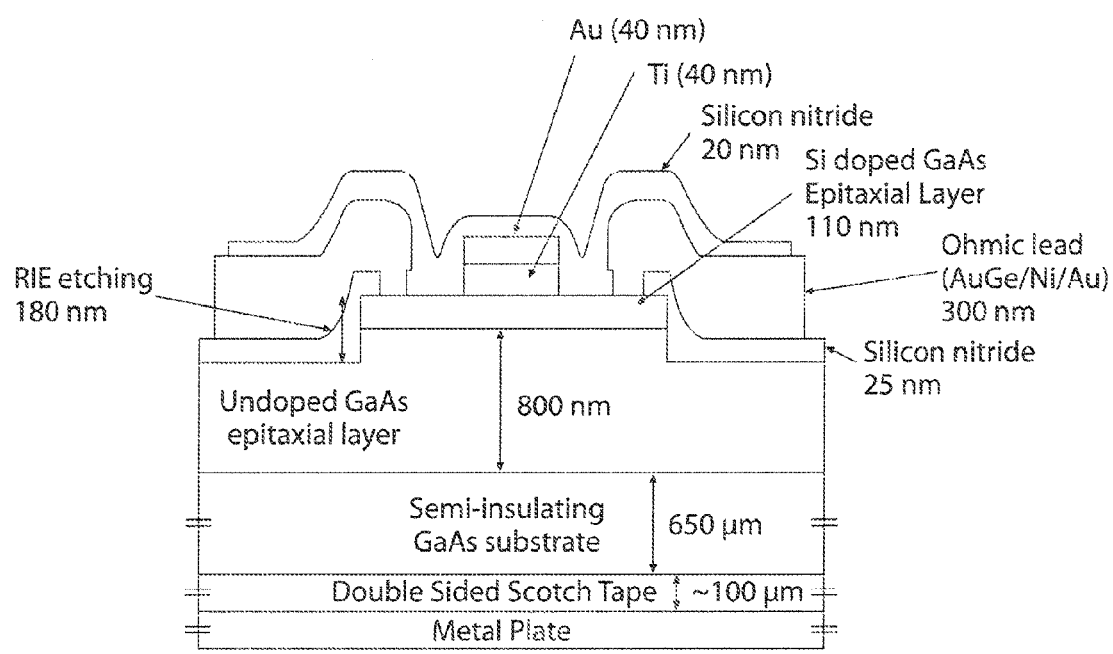
FIG. 8 illustrates another exemplary EOC device in accordance with an embodiment of the present invention.

The semiconductor portion 202 is preferably a thin semiconductor film having a thickness for an active portion thereof of approximately 100 nm. However, it should be understood that other thickness values can be used, for example a thickness for the active layer in a range between approximately 25 nm and approximately 2000 nm, wherein the thickness value is selected to reduce the input resistance for an improvement in thermal noise reduction and signal-to-noise ratio. For example, FIGS. 5 and 8 depict exemplary alternate designs. Furthermore, the semiconductor film 202 may have a length of approximately 100 nm and a width of approximately 50 nm. However, it should be noted other nanoscale length and width values of the semiconductor film 202 can be used, for example nanoscale length and widths whose lower limit is only bounded by lithography capabilities. It should be noted that, as used herein, the term "thickness" will refer to the dimension along the z-axis as shown in FIG. 4, the term "length" will refer to the dimension along the y-axis as shown in FIG. 4, and the term "width" will refer to the dimension along the x-axis as shown in FIG. 4.

The thickness for the metal shunt 204 is preferably greater than approximately 10 nm but less than a maximum of around 10 times the thickness of the active semiconductor layer. However, the inventors note their belief that larger thickness values could in principle be used. As such, it should once again be understood that other thicknesses can be used (for example, any value within a range of approximately 25 nm to approximately 2000 nm, wherein the thickness value is selected to reduce the input resistance for an improvement in thermal noise reduction and signal-to-noise ratio). With respect to the length and width dimensions, a length of approximately 100 nm and a width of approximately 50 nm may be employed. The inventors note that the lateral dimensions for the metal shunt effectively fix the pixel size of the EOC device. As such, reducing these length/width dimensions to the nanoscale is believed to be highly advantageous for achieving high resolution. For an EOC sensor, the width and length of the metal shunt 204 are preferably less than the semiconductor film 202, with the lower limit bounded only by lithography capabilities and any minimal spacing-derived constraints mentioned above.

Further still, it is worth noting that in embodiments where the EOC sensor has a more circular shape rather than a rectangular shape, the diameter of the semiconductor film and metal shunt would serve as the analog to the length and width dimensions.

A useful tuning parameter to control whether the EOC device operates with an I-EOC effect is the spacing between the leads and the metal shunt. As explained below with reference to FIGS. 5 and 8, by reducing this spacing to a value not greater than approximately 500 nm-1000 nm, the inventors believe that the I-EOC effect becomes pronounced. The inventors further believe that other factors can influence the transition from an EOC effect to an I-EOC effect. For example, the mean free path of the carriers in the active layer of the semiconductor portion is believed to impact I-EOC operation, and this property can be controlled through proper selection of the semiconductor, dopant, doping density and temperature. The inventors further note that in an embodiment where the room temperature operation of the device is desired, a desirable dimension for the mean free path is of around the order $\frac{1}{10}$ the desired pixel size, which sets the spatial resolution at room temperature and further defines an upper bound on the dimensions at which the I-EOC device will function. Additional factors that are believed to affect I-EOC operation include the geometric arrangement of the contacts, the height of the Schottky barrier, the intensity of the illumination, and the wavelength of the illumination. The inventors note that the height of the Schottky barrier can be controlled via selective choice of the metal-semiconductor combination, where the height should be designed to give a specific range of depletion widths in the active semiconductor layer and to promote tunneling into the shunt. The inventors further note that the illumination wavelengths can vary based on the wavelengths that one wants to detect with the I-EOC device (for example, a range from the ultraviolet (UV) to the near infrared (IR)).

Preferably, the dimensions of the substrate 206 are sized appropriately to support the dimensions of the semiconductor film 202, and as such the substrate 206 is typically much larger than the semiconductor film and metal shunt. Exemplary dimensions for the substrate 206 are a thickness of approximately 400 µm and a diameter of approximately 2 inches. However, it should be understood that other dimensions could be used.

The EOC sensor 200 also preferably includes two current leads 210 and two voltage leads 212. These leads contact the semiconductor film 202 but not the metal shunt 204. Also, these leads may contact the semiconductor film 202 on a surface along the xz thickness of the semiconductor film 202, as shown in FIG. 4. With respect to the geometry of the leads, the two voltage leads 212 are preferably disposed between the two current leads 210 as shown in FIG. 4. Furthermore, the spacing between leads is preferably selected in a manner to maximize the EOC effect of the EOC sensor 200 (or if the EOC sensor is being employed as a dual EOC/EEC sensor, the spacing can be selected to balance a desired EOC effect and EEC effect).

Figure 1:
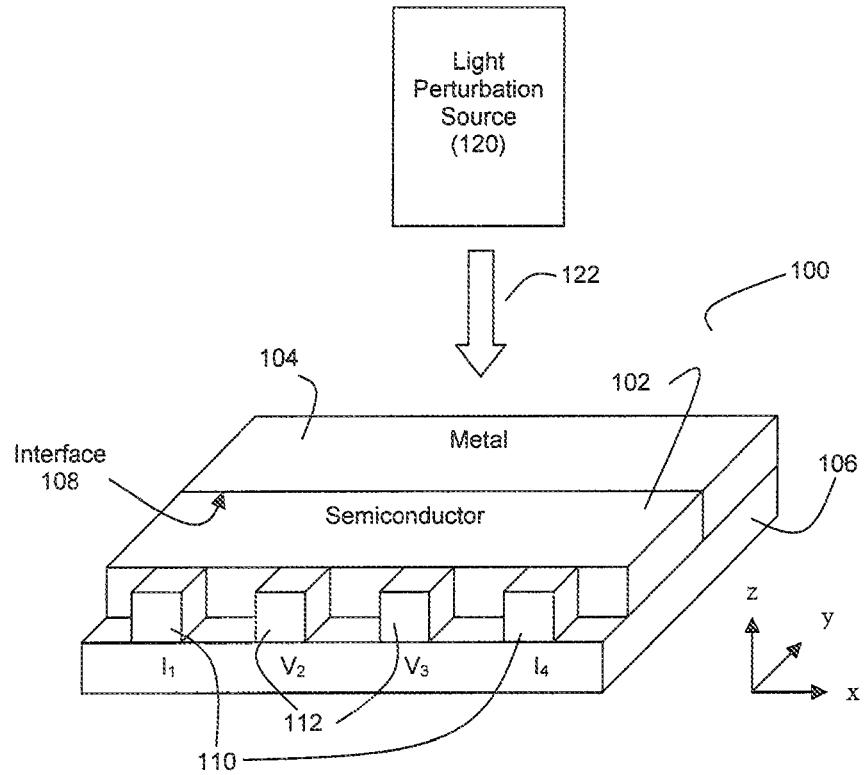
FIG. 1 depicts an exemplary EOC device having an Ohmic semiconductor/metal interface.
Figure 2:
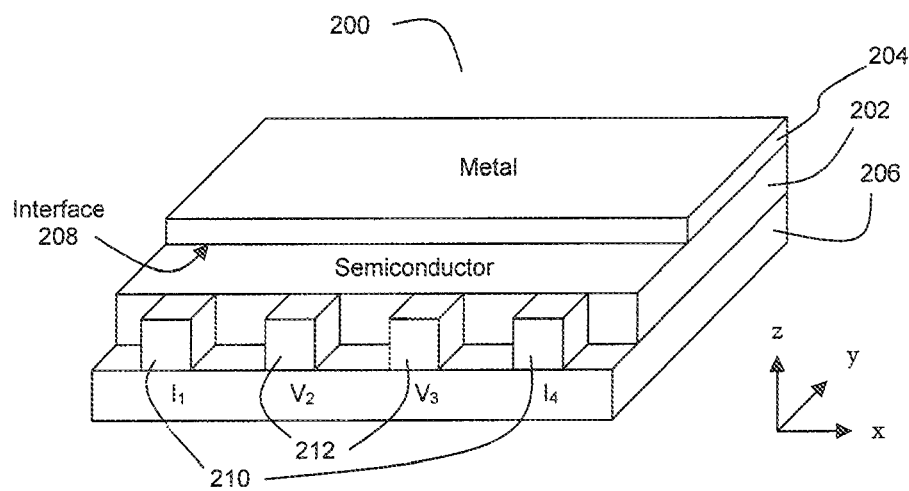
FIG. 2 depicts an exemplary EEC device.
Figure 3:
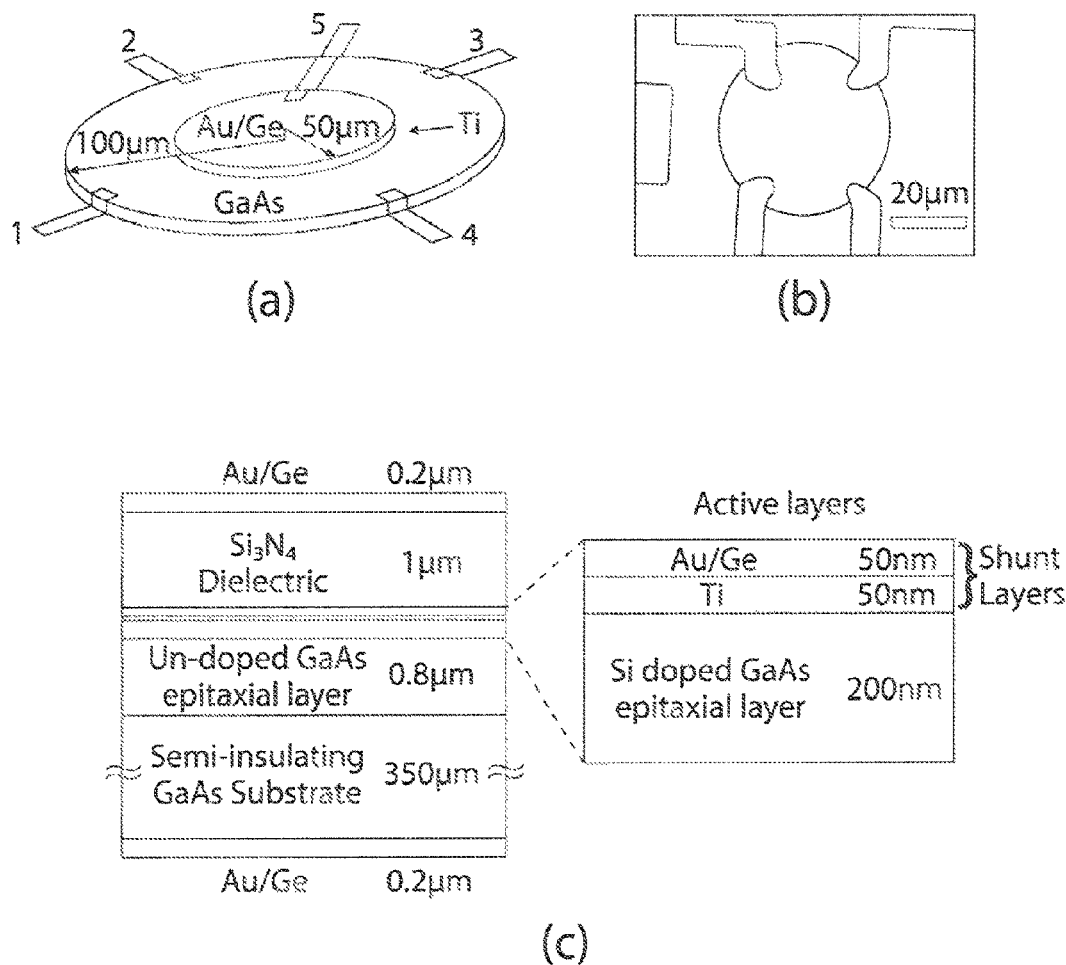
FIG. 3 depicts another exemplary EEC device.

A fifth lead that contacts the metal shunt may also be employed (see, for example, the 5$^{th}$ lead contacting the metal shunt in panel (a) of FIG. 3). Such a lead permits the metal shunt to be independently biased which may allow enhanced performance by the EOC device.

With the EOC sensor 200, a light perturbation 122 from a light perturbation source 120 that impacts the light exposed surfaces of the semiconductor film 202 and metal shunt 204 results in a measurable voltage via the EOC effect. Preferably, the direction of propagation for the light 122 is generally along the z-axis (or perpendicular to the plane of the semiconductor film 202 and metal shunt 204 or substantially in the same plane as the plane of the interface 208). However, as noted below, as the size of the EOC sensor decreases to nanoscale dimensions, the light will more uniformly illuminate the EOC nanosensor due to the EOC nanosensor's small size.

The light perturbation source 120 can be any source of light emissions, such as a laser emitting device or even a cell with fluorescent emissions (such as would be emitted with the introduction of a fluorine-based contrast agent). Further still, the perturbing light 122 can be electromagnetic radiation, spanning infrared to ultraviolet ranges, with wavelengths measured in the hundreds of nanometers. A desired wavelength for the light perturbation can be selected based on the absorptive properties of the active semiconductor layer of the EOC device. Additional examples of types of light perturbations that could be employed in connection with the EOC device include transmission and reflection for cell analysis, as well as fluorescence for chemical analysis and imaging.

As noted above, the inventors have discovered that for larger dimensions of the EOC architecture shown in FIG. 4, the EOC sensor exhibits an EOC response where the effective resistance of the EOC sensor decreases as a function of increasing illumination intensity. However, for smaller dimensions of this EOC architecture, the inventors have unexpectedly discovered that the effective resistance of the EOC sensor not only increases as a function of increasing illumination intensity, but this inverse response is pronounced. As noted above, the inventors have labeled this response an I-EOC response. Following this unexpected result, the inventors have sought to explain and understand its origin.

The inventors first note their belief that the underlying physical principle responsible for an EXX effect is that an external perturbation, such as a photon beam in the case of EOC, applied to an MSH device induces electrical current reallocation between the semiconductor and metal shunt that changes the resistance of the MSH device, and that geometric design (such as the relative sizes and shapes of the metal and semiconductor components or the placement of the contacts) can amplify this change. As noted above, normal EOC in a macroscopic MSH structure using a metal (Au) forming an Ohmic interface with GaAs has already been described (see for example, the above-referenced and incorporated patent applications). With an embodiment of the present invention, the inventors disclose the I-EOC properties of a nanoscopic MSH structure with a Schottky interface (namely a Ti/GaAs Schottky interface).

Figure 6:
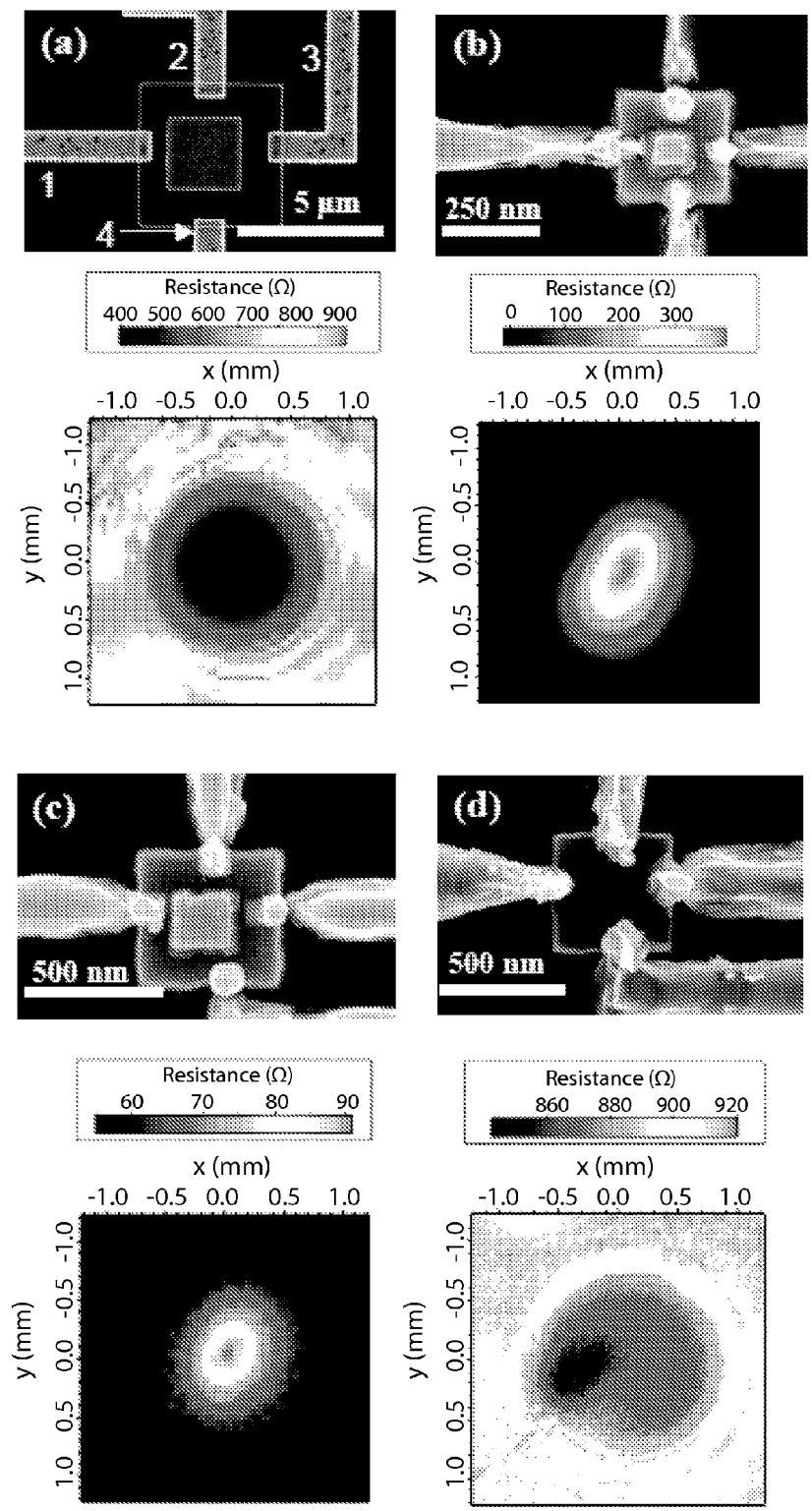
FIG. 6 shows SEM images and resistance image plots of 3 different sizes of EOC devices and a reference shuntless semiconductor device.

These MSH devices with Schottky barrier interfaces were prepared on lattice-matched GaAs epitaxial layers grown by molecular beam epitaxy (MBE). A schematic of an exemplary embodiment of this device structure is shown in FIG. 5 (panels (b) and (c)) and top view electron micrographs are shown in FIG. 6. Four different square shaped devices were fabricated with dimensions as follows for the length and width of mesa that comprises the active semiconductor layer:

5 µm (device A in panel (a) of FIG. 6),
250 nm (device B in panel (b) in FIG. 6),
500 nm (device C in panel (c) of FIG. 6), and
500 nm (device D in panel (d) of FIG. 6, which is a shuntless reference device).

The thickness of the active semiconductor layer for the example of FIG. 5 was 90 nm. A minimum of 4 devices for each EOC device size have been studied; all devices of a specific size show substantially equivalent results. Details of the device fabrication procedures are described in Newaz et al., "Transport measurements and analytical modeling of extraordinary electrical conductance in Ti—GaAs metal-semiconductor hybrid structures", Phys. Rev. B79, 195308 (2009), the entire disclosure of which is incorporated herein by reference. The Ti/GaAs interface forms a well characterized Schottky barrier while the Ti—Au layer acts as a shunt for current crossing the barrier. To ascertain the effect of the shunt, equivalent but shuntless reference devices (see for example panel (d) of FIG. 6) were also studied. All optical and transport measurements presented here were carried out at room temperature. The exemplary EOC devices employ a modified van der Pauw (VdP) mesa structure (see Wang et al., "Extraordinary electroconductance in metal-semiconductor hybrid structures", Appl. Phys. Lett. 92, 262106 (2008), the entire disclosure of which is incorporated herein by reference), in which current is applied between leads 1 and 2 and voltage is measured between leads 3 and 4 (see panel (b) of FIG. 5). The 4-point resistance is defined as $R=V_{34}/I_{12}$.

The inventors have measured the spatial sensitivity of these EOC devices by recording the 4-point resistance as an unfocused He—Ne laser beam (TEM$_{00}$ mode, beam waist diameter 800 µm, output 5 mW, wavelength 632.8 nm) traverses the sensor area in steps, down to 10 µm. The 2D image plot for the largest EOC device, device A of FIG. 6, is shown in panel (a) of FIG. 6 along with the corresponding SEM image (top row). The resistance of device A in FIG. 6 is large when the laser spot is far from the device (minimum illumination intensity) and is the smallest when the laser is approximately centered on the device (maximum illumination intensity). To further quantify the sensing response of the device to the laser source, one can quantify the EOC as $EOC(P)=|[R(hv,P)-R_0]/R_0|\times 100\%$ where P is the laser power density falling on the sensor, R is the 4-point resistance under illumination and $R_0$ is the 4-point dark resistance. The observed maximum EOC values for device A of FIG. 6 is around 60%. The inventors note that an EOC(P) percentage of at least 1% indicates that the optoconductance effect is extraordinary.

Figure 14:
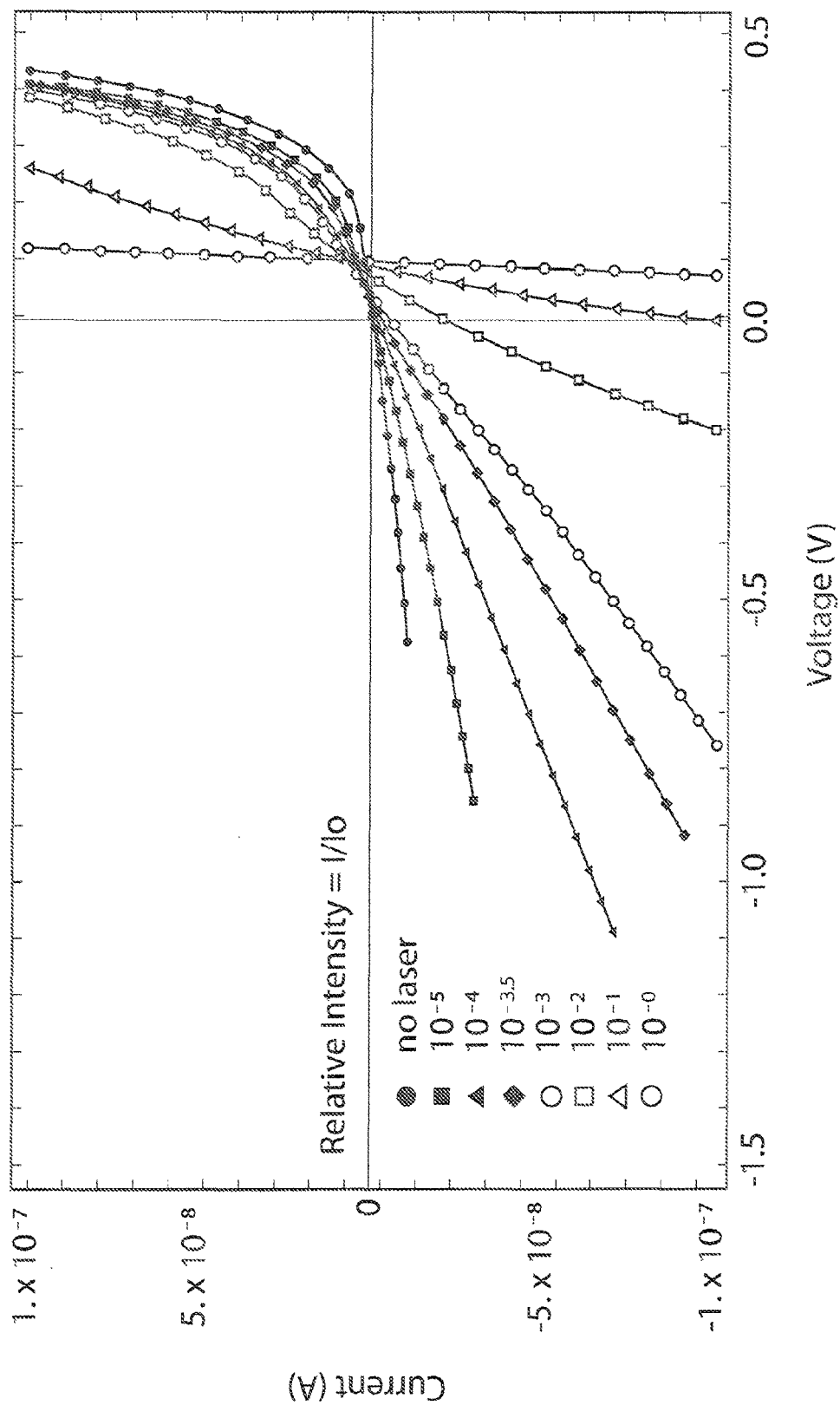
FIG. 14 depicts the intensity dependence of the two-point I-V characteristic of a Schottky diode component of a 5 μm MSH device.

In previous experimentation, as noted above, the inventors had demonstrated the EOC effect for a macroscopic MS hybrid structure with an In shunt making Ohmic contact with one side of the Si-doped GaAs mesa. They observed an maximum EOC of ~60% at room temperature under 477 nm focused illumination with a power density of $6.3\times 10^4$ W/cm. However, as indicated above, embodiments of the present invention differ from those Ohmic interface EOC devices. For example, the EOC devices of an exemplary embodiment of the present invention have a Schottky interface instead of an Ohmic interface. Also, with the EOC devices of an exemplary embodiment of the present invention, the interface is located on top of the mesa instead of on the side. Moreover, in contrast to typical top-gated structures such as FET's, the shunt provides an important and intended current path in the EOC devices. Even though the shunt transparency is only ~1% at 633 nm, this is sufficient to lower the Schottky barrier under illumination and promote current flow through the shunt. The direct I-V measurements shown in FIG. 14 demonstrate this characteristic (see Newaz et al., "A nanoscale Ti/GaAs metal-semiconductor hybrid sensor for room temperature light detection", Applied Physics Letters, 97, 082105 (2010), the entire disclosure of which is incorporated herein by reference). FIG. 14 shows the intensity dependence of the two-point I-V characteristic of a Schottky diode component of a 5 μm MSH device ($I_0=1$ W/cm$^2$). As shown in FIG. 14, the I-V characteristic changes from Schottky-like to Ohmic at high illumination. This is accompanied by a reduction in the zero bias resistance by a factor of 209 with an illumination intensity change of $10^{-5} I_0$ to $I_0$, where $I_0$ is 1 W/cm$^2$. The intensity-dependent open circuit voltage seen in FIG. 14 is characteristic of illuminated Schottky barriers (see S. M. Sze, Physics of Semiconductor Devices, 2$^{nd}$ Ed. (Wiley-Interscience, New York, 1981, pages 793-795), the entire disclosure of which is incorporated herein by reference) and in the subject instance is believed to be almost certainly caused by the migration of photogenerated carriers into the interface/depletion region.

The behavior of device A in FIG. 6 under illumination is qualitatively similar to that of the Ohmic interface EOC structures previously studied by the inventors. Carriers traveling through the shunt lower the resistance of the MSH device. Carriers bypassing the shunt exhibit diffusive transport with a resistivity $\rho=1/(n\mu e)$ where n is the carrier concentration, μ is the drift mobility, and e is the electron charge. The product nμ increases with respect to n and light impinging on the devices A and B reduces their 4-point resistance. Since the shunt is almost opaque, the observed response can be distinguished from the lateral photovoltaic effect (LPE). Moreover, the asymmetric placement of the leads and shunt inherent in the e-beam fabrication (e.g. the gap between the lead and shunt varies with lead position (see FIG. 6)) provides the symmetry breaking desired for an EOC output from a uniformly illuminated device.

Remarkably and unexpectedly, the optical characteristics for devices B and C of FIG. 6 are opposite to that of device A of FIG. 6 (as well as the reference device D of FIG. 6). The 2D image plots of the resistance along with the SEM images of devices B and C in FIG. 6 are shown in panels (b) and (c) of FIG. 6, respectively. Here the resistance increases drastically with increased illumination. The different physical process now prevalent must overcome the reduction in the resistance originating from the electron-hole pair generation, as observed for larger device A of FIG. 6 (and for reference device D of FIG. 6).

Figure 7:
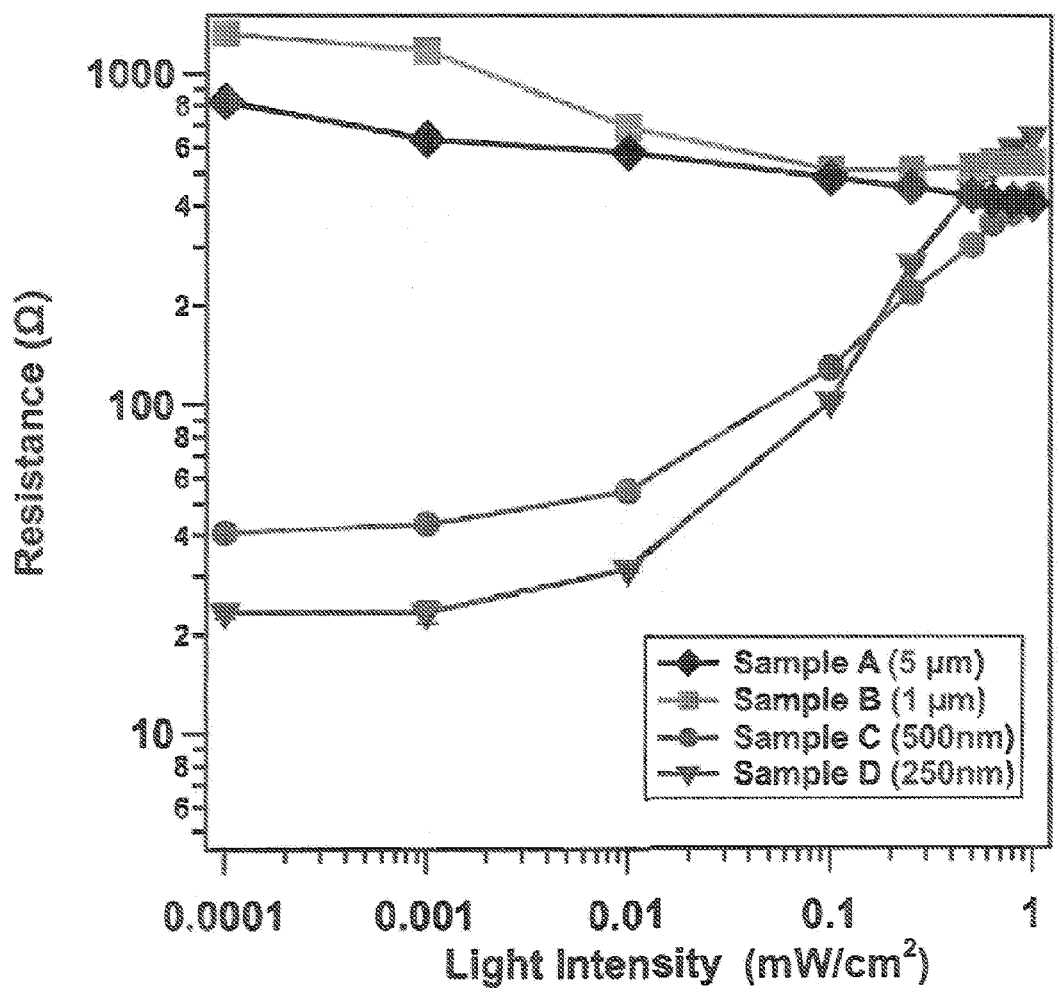
FIG. 7 plots resistance versus light intensity for the 4 different sizes of EOC devices shown in FIG. 6.

A comparative study of dynamic responses for different size EOC devices with respect to light intensity is presented in FIG. 7 (in this study, Sample A was a 5 μm EOC device with a Schottky interface, Sample B was a 1 μm EOC device with a Schottky interface, Sample C was a 500 nm EOC device with a Schottky interface, and Sample D was a 250 nm EOC device with a Schottky interface. The light intensity attenuation was created by placing neutral density (ND) filters in the path of the beam that illuminated the EOC devices. The response curves clearly demonstrate a wide dynamic range, as high as 40 dB, for the submicron EOC devices (Samples C and D of FIG. 7). By considering the Gaussian beam profile, the almost opaque shunt and contacts, and the absorbance of the illuminated region of the doped GaAs epilayer one can find EOC % (P) values for Samples C and D of FIG. 7 of 975% (1.0 nW) and 9460% (0.25 nW), respectively. Note that the EOC values for submicron devices are around 16-160 times higher than those of Samples A and B of FIG. 7.

To emphasize the role of the shunt, the inventors have also studied bare (shuntless) control devices such as that shown in panel (d) of FIG. 6 and panel (a) of FIG. 5. The optical characteristics of the 500 nm control device are also similar to that of device A in FIG. 6 but the maximum EOC (2 nW) is only 6%, e.g. significantly smaller than that from all the EOC devices that have shunt metal on top of the mesa. With a maximum power density of 1 W/cm$^2$ of 632.8 nm radiation and radiative recombination the steady state photoinduced carrier density is $n_{ph} \approx 1.5\times 10^{16}$ cm$^{-3}$. This alone accounts well for the 6% EOC % (P) of the control device and emphasizes the enhancement of EOC % (P) by the shunt, which impacts the magnitude of the response and (see below) the inverse nature of the sub micron structures.

To interpret these results, the inventors note that if the lateral geometry and placement of the shunt leads is preserved, the measured photoresistance R(P) values should depend only on the steady state resistivity. If the same recombination process is prevalent in each device, $n_{ph}$, is fixed and the devices would have approximately equal resistances at maximum illumination, and the inventors conclude that all devices are diffusive in this limit. The inventors further believe that the I-EOC response in submicron devices can be explained qualitatively by considering the ballistic and quasi-ballistic carrier transport in addition to the diffusive transport. The electrical resistance of any conductor arises from momentum scattering of charge carriers. When the conductor's length becomes comparable to the mean free path of the carriers, $\lambda_p$, the probability that the electron travels without scattering at all, i.e., ballistically, increases. Ballistic transport of electrons in GaAs devices with submicron dimensions has been established by many researchers. (See Hays et al., "Hot-Electron Spectroscopy of GaAs", Phys. Rev. Lett. 54, 1570 (1985); Palesvki et al., "Lateral Tunneling, Ballistic Transport, and Spectroscopy in a Two-Dimensional Electron Gas", Phys. Rev. Lett. 15, 1776 (1989)).

For ballistic transport along a wire contacted at the ends, the resistance of the wire is zero and all of the voltage drop is at the two contacts. At low bias, the introduction of a sufficient density of photo-induced carriers will give rise to carrier-carrier scattering resulting in finite resistance between the contacts and correspondingly in a transition from ballistic to diffusive transport. If one assumes that recombination is dominated by the Auger process (see Brozel et al., "Properties of Gallium Arsenide $3^{rd}$ Ed.", INSPEC, London (1996)), it can be shown that the steady state carrier density induced in the inventors' illumination studies of devices B and C in FIG. 6 and Samples C and D in FIG. 7 is in the range $1 \times 10^{18}$ cm$^{-3}$ to $1 \times 10^{20}$ cm$^{-3}$, far in excess of the carrier density due to doping.

Figure 10:
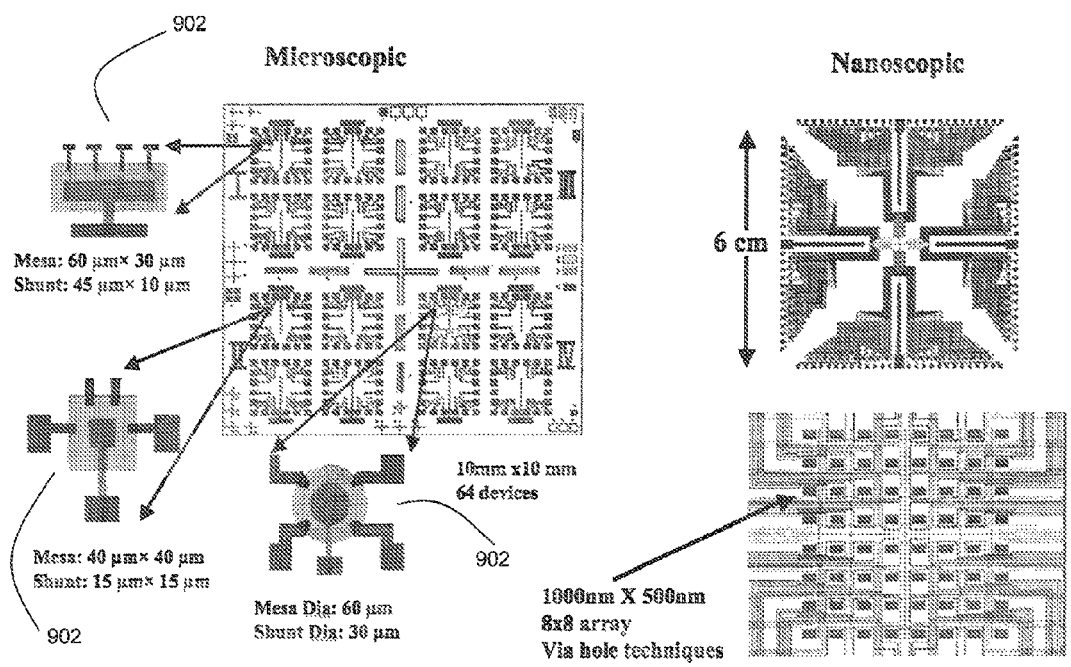
FIG. 10 depicts schematic diagrams for exemplary multi-EOC device arrays showing various pixel geometries.

To characterize the carrier transport mechanism inside the MSH structure, the inventors have also conducted temperature dependent transport measurements of the GaAs epitaxial layer using a conventional Hall bar, fabricated from the same wafer. (See Gilbertson et al., "Dimensional crossover and weak localization in ultra thin n-GaAs films", Appl. Phys. Lett. 95, 012113 (2009)). The value of $\lambda_p$ has been found to vary from 18 nm at 2K to 35 nm at 300K, which is in reasonable agreement with the values measured by hot-electron spectroscopy and electron energy spectroscopy. Because of the space constriction for the submicron devices and e-beam lithography limitations the actual separation of the Ohmic leads and shunt varies from 20 nm to 40 nm for device C of FIG. 6 and 10 nm to 30 nm for device B of FIG. 6. Hence the separation between the Ohmic leads and Shunt metal is well below $\lambda_p$ for device B of FIG. 6 and smaller or of the same order as $\lambda_p$ for device C of FIG. 6. Therefore, the ensemble of charge carriers in the submicron devices (Devices B and C of FIG. 6) will have two types of carriers, one traveling ballistically and the other travelling diffusively in the gap.

In the dark, the majority of the carriers are ballistic. This explains why the dark resistance of nanoscopic devices is lower than that of the macroscopic devices (see FIG. 7). In the presence of laser radiation the electrons traveling from the Ohmic lead to the shunt metal and shunt metal to the collector electrode will have a small probability of traveling ballistically and more electrons will be forced to traverse the gap diffusively. As a result of increasing the number of electrons taking part in dissipative motion, the resistance of the submicron EOC device increases in the presence of optical photons. Of course, additional carriers traveling diffusively through the semiconductor and the shunt will also contribute to a decrease of resistance of devices B and C of FIG. 6 due to the photon perturbation, but this change is overpowered by the change originating from the transition of ballistic carriers into diffusive motion which causes an overall increase in resistance.

The ten-fold larger EOC values of device B of FIG. 6 relative to that for device C of FIG. 6 can also be attributed to the ballistic and quasi-ballistic traversal of the carriers by similar arguments. For smaller separation between the Ohmic lead and the shunt a larger number of electrons are traveling ballistically; hence the response to illumination will be more acute for smaller gap devices. Presumably, the increase in EOC with decreasing device size will ultimately be limited by boundary scattering.

The inventors' explanation for the observed increased photoresistance exhibited by Devices B and C of FIG. 6 can be summarized as follows: At low bias, the introduction of a sufficient density of photoinduced carriers gives rise to additional scattering (from photoionized traps or scattering centers) resulting in a transition from ballistic to diffusive transport and a corresponding increase in resistance. If this increase in resistance is greater than the reduction due to the photoinduced carrier density (6%) and the influence of the shunt, a positive photoresistance will result. The exact mechanism for the conversion from ballistic to diffusive transport will depend on the specifics of the excitation and recombination mechanisms; however, the lower R0 of the 500 and 250 nm devices supports the assertion that these are in the ballistic regime and the convergence of the resistance of all four devices within a factor of 2 under maximal illumination supports a size-independent final diffusive state.

To evaluate the sensitivity of the I-EOC sensors using a more conventional metric and to compare them with competitive devices, the inventors have also calculated, at minimum illumination, the responsivity, $R_V = \Delta V/\Delta P$, where $\Delta P$ is the laser power incident on the active area and $\Delta V$ is the corresponding voltage change and the specific detectivity, $D^* = R_V \sqrt{A_D}/V_n$, where $A_D$ is the active area of detection and $V_n$ is the root-mean-square noise voltage per unit bandwidth. (See Shahan et al., "Characterization of near-infrared n-type $\beta$-FeSi$_2$/p-type Si heterojunction photodiodes at room temperature", Appl. Phys. Lett. 94, 222113 (2009)). For device B of FIG. 6, the inventors have found a resistance change of 16.7 Ohms for $2.5 \times 10^{-14}$ W laser power after passing through a 40 dB ND filter. Since, the current through the device was 100 nA, $R_V = 6.68 \times 10^6$ V/W. In the Johnson noise limit, $V_n$ can be replaced by the thermal noise voltage, $V_n = \sqrt{4kTR_0}$, where T is the temperature and $R_0$ is the dark resistance. Hence, for our smallest submicron device $D^* = 5.06 \times 10^{11}$ cm$\sqrt{Hz}$/W. This is among the highest values measured for individually addressable pixels of photodetectors as can be seen from Table 1 below.

TABLE 1

A comparison of individually addressable VLSI/ULSI-compatible photodetectors.

| Sensor Type | Pixel dimensions (μm) | Pixel Pitch (μm) | Detectivity, D* (cm√Hz/W) | Optical Wavelength (nm) | Functioning Temperature [Ref.] |
|---|---|---|---|---|---|
| I-EOC sensor | 0.250 | | $5.06 \times 10^{11}$ | 633 | 300 K |
| Metal-semiconductor-metal PD | 14 | 20 | $1.74 \times 10^9$ | 300-500 | 300 K |
| Si—CCD | 24 | | $1.0 \times 10^{14}$ | 400-900 | 253 K |
| CMOS buried double junction PD | 180 | 210 | $1.9 \times 10^{12}$ | 525 | 300 K |
| Si—PIN PD | 200 | 220 | $3 \times 10^{13}$ | 400-800 | 300 K |

In this comparison, the metal-semiconductor-metal PD is described in Brozel et al., "Properties of Gallium Arsenide $3^{rd}$ Ed.", INSPEC, London (1996), the Si-CCD sensor is described in Hays et al., "Hot-Electron Spectroscopy of GaAs", Phys. Rev. Lett. 54, 1570 (1985), the CMOS buried double junction PD is described in the art, and the Si-PIN PD is described in Palevski et al., "Lateral Tunneling, Ballistic Transport, and Spectroscopy in a Two-Dimensional Electron Gas", Phys. Rev. Lett., 15, 1776 (1989).

As is evident from Table 1, in the mesoscopic regime D* is inadequate as a metric since it does not incorporate the spatial resolution limit of a detector. Thus the detector with the highest D* in Table 1 has a spatial resolution that is two orders of magnitude poorer than that of the 250 nm I-EOC detector. Moreover, the detector with the next best spatial resolution, the MSM PD, is more than a factor of 50 larger and has a lower D* by more than two orders of magnitude. Also note that the operating principles of I-EOC submicron devices show no immediate limiting factor preventing a further reduction of the dimension of the devices to sizes lower than 250 nm. With the advent of current semiconductor fabrication technology, it is believed that one can fabricate functional I-EOC devices as small as 50 nm, which the inventors believe will bring unprecedented spatial resolution in imaging and other photonic applications.

FIGS. 5 and 8 depict exemplary embodiments of an I-EOC nanosensor in accordance with the present invention. As shown in panel (b) of FIG. 5, the I-EOC nanosensor of FIG. 5 has a largely square shape with a symmetric vdP plate architecture. However, as noted above other shapes could be employed, including but not limited to rectangular and circular shapes. The cross-sectional view of FIG. 5 depicts a metal shunt formed from a 40 nm thick layer of Au and a 40 nm thick layer of Ti. This metal shunt is deposited on a 100 nm thick Si doped GaAs epitaxial layer, which resides on the mesa of an 800 nm thick undoped GaAs epitaxial layer. As can be seen in FIGS. 5 and 8, the semiconductor layer 202 of the device 200 comprises a doped semiconductor layer and an undoped semiconductor layer. The undoped semiconductor layer (which may be an undoped GaAs epitaxial layer) serves as a buffer between the substrate 206 and the doped semiconductor layer. The doped semiconductor layer serves as an active layer for the device 200 where current flow occurs. This undoped buffer layer facilitates deposition of the active layer with appropriate crystalline properties. Reactive ion etching (RIE) was used to form the 180 nm thick mesa from the semiconductor material. During fabrication, preferably the undoped semiconductor layer is put down first. Then, the doped active semiconductor layer is deposited on top of the undoped layer. Then, a mesa is formed by etching away material that is outside the patterned area.

A semi-insulated GaAs substrate supports the semiconductor portion and metal shunt portion as shown in FIG. 5. Ohmic leads 1-4 (AuGe/Ni/Au) of around 180 nm thickness are placed in contact with the semiconductor portion of the EOC device as shown in panels (b) and (c) of FIG. 5. Also, a silicon nitride layer of approximately 50 nm may be used to cover the upper surface of the EOC device as shown in panel (c) of FIG. 5. This silicon nitride layer serves as non-porous insulator, preferably having a high dielectric constant. The silicon nitride layer electrically isolates the EOC device from any ionic biological fluid that would be used to deposit a cell on the surface of the EOC (should the EOC be employed for cell imaging purposes). Preferably, this silicon nitride layer is as thin as possible if it is desired to employ the EOC device as a dual EEC/EOC device. The outer surface of the EOC device is potted with epoxy that forms a dish so that the leads do not contact such liquids.

As explained above, the length and width dimensions for the metal shunt and semiconductor portion can vary. For example, in the embodiment of FIG. 5, it can be seen from panel (b) of FIG. 5 that the length and width of the metal shunt 204 is approximately 2.5 µm and the length and width of the semiconductor layer 202 is approximately 5 µm. However, it should be understood that other dimensions could be employed. Furthermore, should a more circular I-EOC device be designed, the diameter dimensions used for the device components can be similar to the length/width dimensions of the rectangular design shown in FIG. 5.

The inventors believe that the spacing dimension 500 between the metal shunt and the leads is a parameter that can be used to tune the EOC device to operate with an I-EOC effect. This spacing dimension 500 is preferably measured as approximately the minimum distance between an outer edge of the metal shunt and the location closest to the metal shunt where a lead contacts the active semiconductor layer. In the example of FIG. 5, it can be seen from panel (b) of FIG. 5 that this lateral spacing dimension can be around 500 nm. However, as noted above, a spacing 500 of around 250 nm was also studied, and these studies indicates a pronounced I-EOC effect at 250 nm. It is believed that a spacing 500 on the order of the mean free path of the carriers in the active semiconductor layer is desirable. For a GaAs active layer, this means a spacing 500 of around 50 nm. The inventors further note that a minimum spacing dimension 500 may exist as noted above. Furthermore, it should be noted that each lead could have its own spacing 500 that is different than the spacing 500 of the other leads with respect the metal shunt. However, this need not be the case as symmetric spacing between the leads could be used.

As noted above, other factors that can influence the transition from an EOC effect to an I-EOC effect include the mean free path of the carriers in the active layer of the semiconductor portion is believed to impact I-EOC operation, the geometric arrangement of the leads contact, the height of the Schottky barrier, the intensity of the illumination, and the wavelength of the illumination.

While the metal shunt of FIGS. 5 and 8 was formed from Ti/Au, it should be noted that other metals could be used. It is believed that any metal which forms a proper Schottky barrier with the chosen semiconductor active layer could be used. For a GaAs active layer, such suitable metals include, but are not limited to, Cu, Au, Ag, Fe, Ni, Al, etc. Furthermore, semiconductor materials other than GaAs could be employed in the semiconductor layer, including but not limited to InAs, AlAs, Si, Ge, InSb, etc.

FIG. 8 depicts another exemplary embodiment for an I-EOC nanosensor, with slightly different dimensions than the design of FIG. 5. For example, in the design of FIG. 8, the silicon nitride layer on the upper surface of the sensor is 20 nm thick. Also, the Si-doped GaAs epitaxial layer is 110 nm thick. Furthermore, a second silicon nitride layer (around 25 nm thick) is deposited to interface the leads with the semiconductor portion such that the leads contact only the mesa portion of the semiconductor portion (namely the upper surface of the Si doped GaAs epitaxial layer). This second silicon nitride layer serves as an insulation layer that isolates the leads from the substrate and the undoped semiconductor layer in order to avoid a photoconductive contribution from the substrate and undoped semiconductor layer in the detected voltage response. The ohmic leads are also thicker, around 300 nm. The substrate has a thickness of around 650 µm. FIG. 8 further shows the EOC device being attached to metal plate via double-side Scotch tape having a thickness of around 100 µm. While a metal plate was used in this embodiment, any support structure that is sufficiently rigid could be used to support the EOC device.

Exemplary embodiments of EOC devices such as those shown in FIGS. 5 and 8 can be prepared using lattice-matched GaAs epitaxial layers, grown by molecular-beam epitaxy (MBE). The active semiconductor layer can be an Si-doped GaAs epitaxial layer (e.g., mobility $\mu = 4400$ cm$^2$V$^{-1}$s$^{-1}$) and carrier concentration $N_D = 4 \times 10^{17}$ cm$^{-3}$) followed by an undoped epitaxially grown GaAs layer as a buffer with a semi-insulating GaAs substrate at the bottom. The mesa can be first fabricated using standard optical lithography and wet etching. Second, AuGe/Ni/Au metal layers for the Ohmic leads can be deposited followed by a thermal annealing at 450° C. for 1 minute. The four contacting pads of the leads can be symmetrically distributed around the periphery of the meas disk and Ohmic contacting to the surface is achieved.

Next, concentric double metal layers are deposited, comprising a Ti thin film, which has an intimate contact to the GaAs epitaxial layer to form a Schottky interface, and an Au/Ge thin film, which acts as an effective shunt for electron transport. Ti and Au metals can be deposited sequentially in a metal evaporation system. Before depositing metal for Ohmic leads and the shunt, one can etch the surface oxidation by dipping the sample in an HCl:DI (1:2) solution for 5 minutes and quickly transferring the sample to the evaporation system. If desired, an additional bonding lead can be attached to the shunt for biasing purposes. A silicon nitride insulating dielectric layer can be deposited on the surface of the device by plasma-enhanced chemical vapor deposition (PECVD) and etched with a plasma etcher. Preferably, the silicon nitride layer between the leads and the semiconductor is deposited after the mesa is cut and before the leads and shunt are deposited.

Figure 9A:
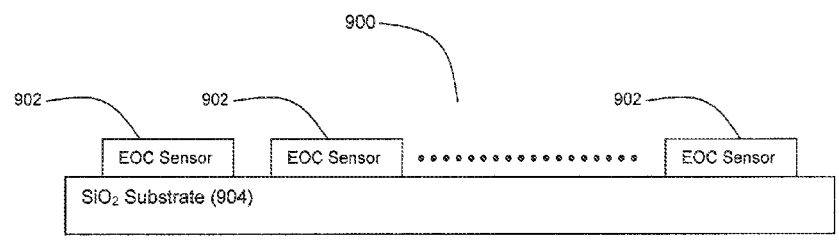
FIG. 9(a) is a cross-sectional view of an exemplary array of EOC devices.
Figure 9B:
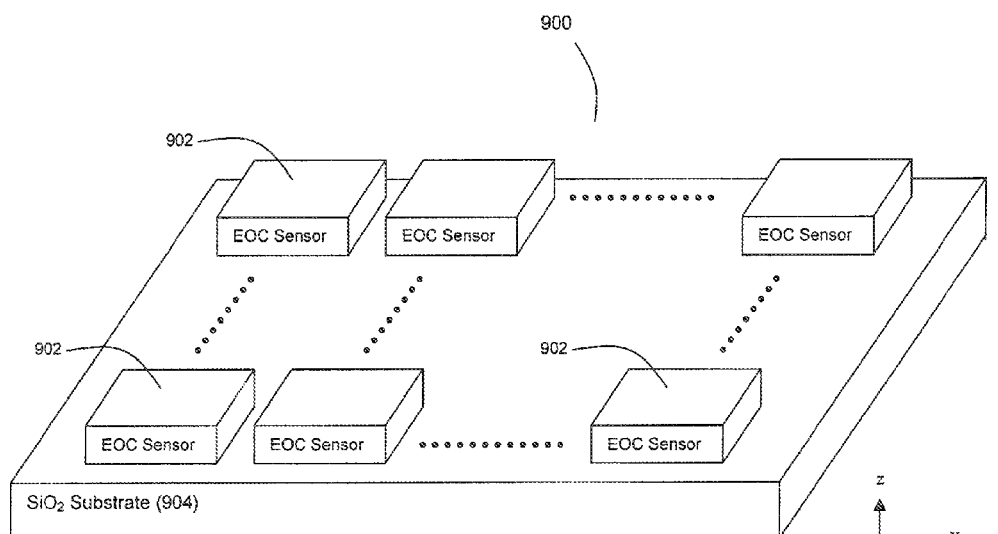
FIG. 9(b) is a perspective view of the array of FIG. 9(a)

The EOC nanosensors described above in connection with FIGS. 4, 5 and 8 can be combined to create an N×M array 900 of multiple nanoscale EOC sensors 902 as shown in FIGS. 9(*a*) and 9(*b*). The values of N and M can be chosen by practitioners of the present invention as a design choice based on their intended use of the nanoscale EOC sensors (e.g., 4×4, 16×16, 2×20, 64×64, etc. with upper values only bounded by manufacturing capabilities). For example, the inventors contemplate that nanosensor matrix dimensions judging from current digital display technologies can also be 640×480, 800×600, 1024×768, 1600×1200, 2048×1536, and 3200×2400. Preferably VLSI or ULSI techniques are used to fabricate such arrays. These nanoscale EOC sensors 902 can be deposited on an array substrate 1204 such as an $SiO_2$ substrate. An exemplary thickness for substrate 904 is approximately 400 μm, although other thicknesses can be used. It should be noted that the voltage and current leads of the individual nanoscale EOC sensors are not shown in FIGS. 9(*a*) and (*b*) for ease of illustration. It should also be noted that a via design for row/column pin-out addressing from the matrix of nanosensors 902 in the array 900 can be used, particularly for arrays having large numbers of nanosensors (see FIG. 10). For the array structures shown in FIG. 10, each of the 4-leads for the EXX sensors 902 can be individually addressable, thereby yielding $4n^2$ pin-outs for an n×n array. Furthermore, these leads can be selectively combined to yield a reduction to $3n+1$ pin-outs for an n×n array.

It should also be noted that in instances where the individual EOC sensors are designed to have a substrate 206 of the same material as substrate 904, then the EXX sensor 902 that is located on array 900 will not need to include substrate 206 as the material of substrate 904 can then serve as the appropriate substrate. However, if the substrate materials are dissimilar, then the individual EXX sensors 902 will preferably include their own substrate 206 (e.g., when the EOC sensor 902 has a GaAs substrate 206 while the array 900 has an $SiO_2$ substrate 904). Preferably, the array 900 exhibits tight spacing between EOC sensors 902. For example, a spacing value that falls within a range of approximately 50 nm to approximately 1000 nm can be used.

It should be noted that because the EOC sensors of the present invention can also serve as EEC sensors, the array 900 can be dual-purpose in that it can be employed to simultaneously (or nearly simultaneously) detect both photon and electric charge signals. Such dual use permits the generation of multifunctional images having extremely high spatial resolution.

Also, the array 900 can include not only EOC/EEC sensors but also other sensors having different architectures such as the EMR/EPC/EAC sensors described in the above-referenced and incorporated patent applications. Integrating multiple different types of EXX nanosensors in an array (such as EPC and EOC/EEC nanosensors) would provide for a screening system capable of performing HCS for prospective interrogation of cells based on the outcome of charge and fluorescent imaging, like LSC. However, the resolution of the acoustic subsystem will be equal to or greater than that obtained from optical microscopy, and moreover will represent volumetric data (i.e., not be limited to a single focal plane at a time), as the time axis of the digitized ultrasound waveforms contains information that can be mapped to distance into the cell being imaged via the dispersion relationship directly analogous to imaging organ structures with currently available clinical ultrasound systems. This type of instrumentation would offer several advantages not available in current cytometry/microscopy instruments such as simultaneous acquisition of volumetric data based on nanoscale acoustic microscopy, higher resolution than current optical microscopy without necessarily requiring expensive high intensity light sources, high precision and resolution surface charge measurements without the complications and ambiguities inherent in electrophoretic techniques, and high resolution, low noise fluorescent imaging.

Figure 11A:
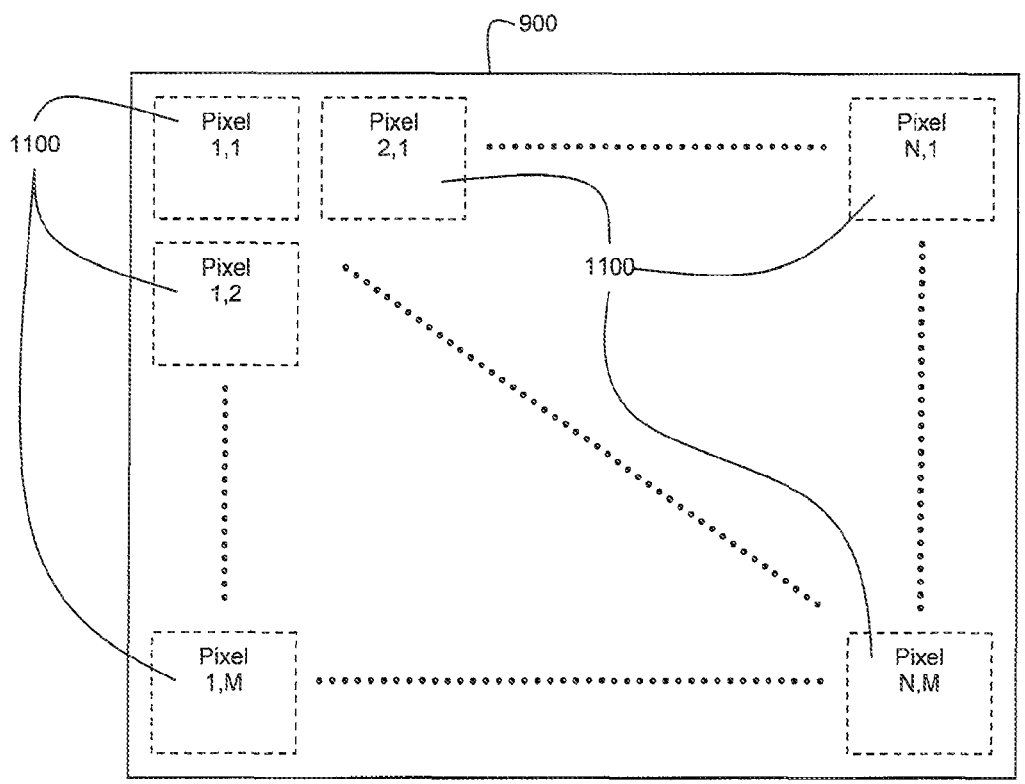
FIG. 11(a) is a top view of an exemplary array whose nanosensors are organized as a plurality of pixels.
Figure 11B:
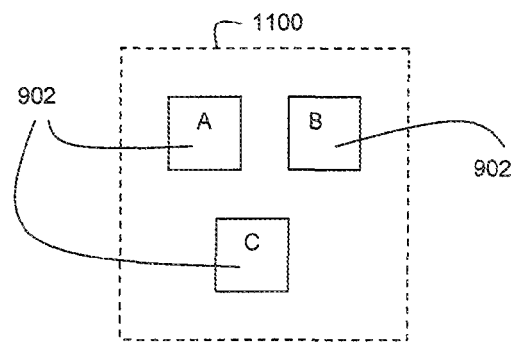
FIG. 11(b) is a top view of a pixel corresponding to a plurality of different types of nanosensors.

It should also be noted that the array 900 can be thought of as being subdivided into a plurality of pixels 1100, as shown in FIG. 11(*a*), with each pixel preferably being individually addressable. Each pixel 1100 can comprise one or more EOC nanosensors 902. For example, as shown in FIG. 11(*b*), a pixel 1100 can comprise a plurality of different types of nanosensors 902, such as 3 nanosensors of types "A", "B", and "C" (wherein type "A" could correspond to an EOC/EEC nanosensor, wherein type "B" could correspond to an EPC nanosensor, wherein type "C" could correspond to an EMR nanosensor). Such groups of different types of nanosensors within a pixel 1100 can be helpful for increasing the sensitivity of the array 900 by using signal averaging techniques on the voltage responses of the nanosensors.

Similarly, it should be noted that pixels 1100 or portions thereof can be grouped with other pixels 1100 or portions thereof to form composite pixels. For example, FIG. 12(*a*) depicts a composite pixel 1200 formed from a grouping of 4 pixels 1100 of the arrangement shown in FIG. 12(*b*). Furthermore, the composite pixel 1200 can be formed of only a single type of nanosensors (e.g. only the "A" type nanosensors within those four pixels 1200, as shown by the boldface notation in FIG. 12(*a*)). Once again, such arrangements of composite pixels can be helpful for increasing sensitivity through the use of signal averaging techniques.

Figure 12A:
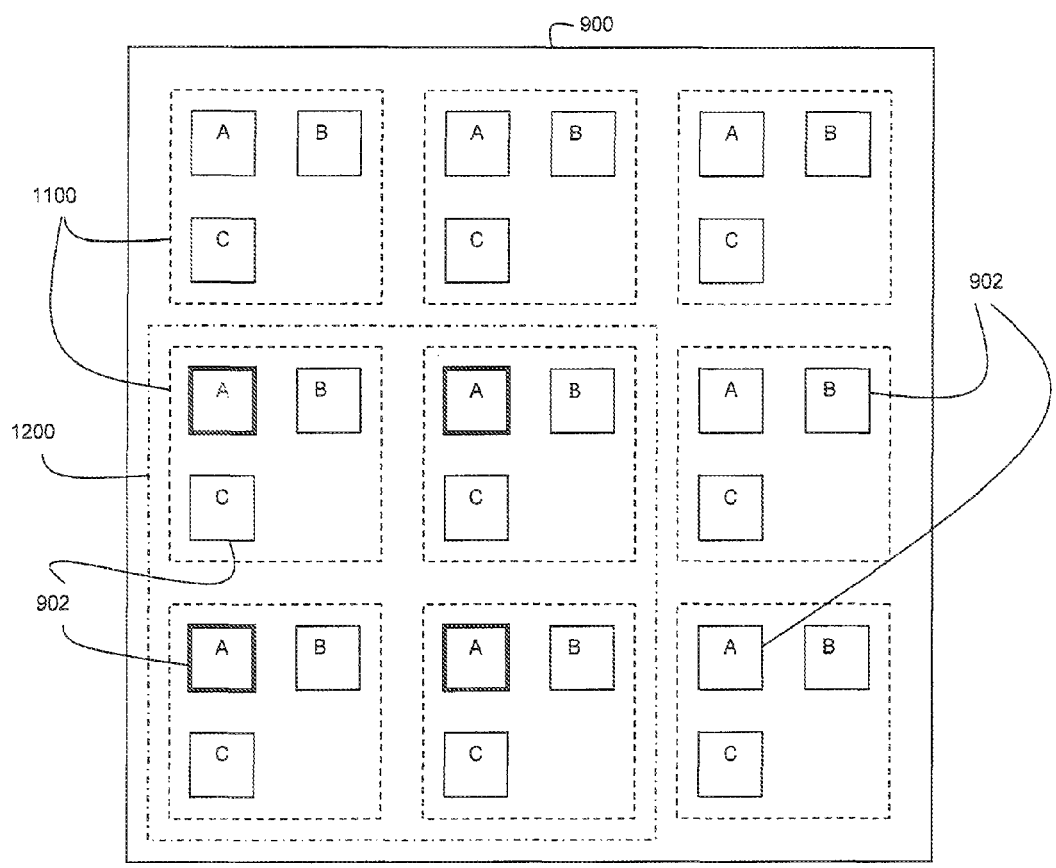
FIGS. 12(a) and (b) depict exemplary arrays that show how different nanosensors can be grouped into composite pixels.
Figure 12B:
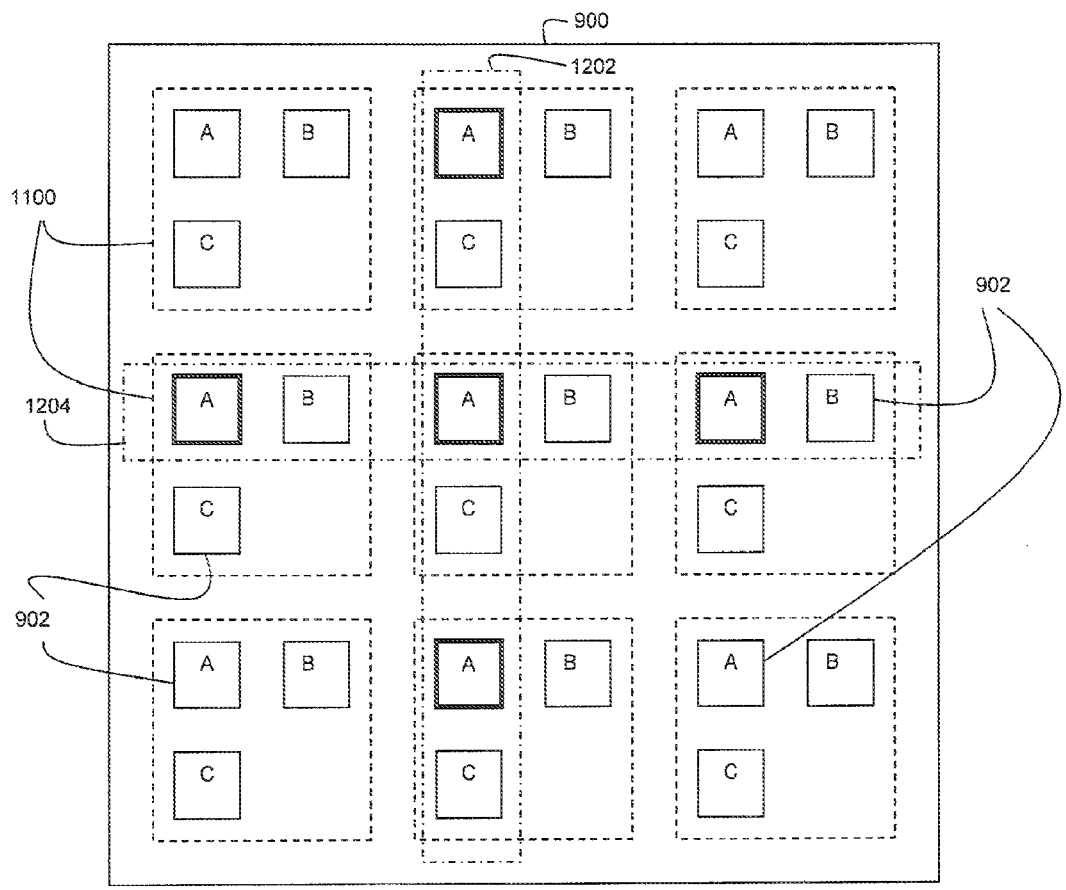

FIG. 12(*b*) depicts an example of a composite pixel 1202 that is formed from a plurality of nanosensors of the same type that are arranged in a straight line and has a length of a plurality of pixels 1100 (e.g., the "A" type nanosensors shown in boldface within composite pixel 1202). FIG. 12(*b*) also depicts an example of a composite pixel 1204 that is formed from a plurality of nanosensors of the same type that are arranged in a straight line orthogonal to composite pixel 1202 and has a length of a plurality of pixels 1100. Composite pixels arranged such as composite pixels 1202 and 1204 can be useful for phase-type imaging of optical signals, polarizing deflected light, or detecting different acoustical modes (e.g., shear, transverse, various plate modes) depending on the type of nanosensor employed.

As an object such as one or more cells is placed into contact with the array 900 on the exposed surfaces of the EEC/EOC sensors 902, and as the EEC/EOC sensors 902 of the array are perturbed, the voltage responses of the various EEC/EOC sensors 902 can be measured, digitized, stored, and processed by receiver electronics including a signal processor (not shown). The collection of voltage responses can in turn be selectively pixelized based on the spatial relationship among the EEC/EOC sensors to generate an image of the object that is indicative of one or more characteristics of the object. Both single-modality images and multi-modal parameterized images can be generated by registering and combining the output from different types of nanosensors. Because of the nanoscale of the array's EXX sensors, the resultant images would also exhibit a resolution that is nanoscale. Furthermore, each nanoscale EEC/EOC sensor 902 can be independently addressable by the receiver electronics to permit an increased data acquisition rate (imaging frames of a given area of an object per unit time). Also, it should be noted that to enhance the ability of cells to grow and adhere to the array surface, the exposed surface of the array on which the one or more cells contact the array can be coated with a protein such as fibronectin, vitronectin, collagen, or a protein-mimetic such as poly-l-lysine or silane.

For example, with an array 900 comprised of multiple EAC and EEC/EOC sensors 902, after a cell is placed on that array, the array can be perturbed with an acoustic wave to obtain voltage responses from the EAC sensors from which an ultrasonic image of the cell having nanoscale resolution can be generated. At the same time, the EEC sensors on the array 900 can be perturbed with a surface charge from the cell itself to produce voltage responses from the EEC sensors from which an image having nanoscale resolution and representative of the spatial distribution of electric charge over the cell can be generated. Further, still, because the surface charge from the cell is not likely to perturb the EAC sensors and because the acoustic wave is not likely to perturb the EEC sensors, cross-talk between the EEC and EAC sensors can be minimized, and images of multiple characteristics of the cell can be simultaneously generated.

Furthermore, to employ the dual EEC/EOC devices in the same array for both their EEC and EOC effects (whether in an EEC/EOC array singly or in combination with other EXX devices), one could minimize cross-talk issues between the EEC and EOC responses by time sequencing the perturbation sources. When the light source is off, one could sample the EEC/EOC devices for their EEC response. When the light source is on, one could sample the combined EEC and EOC responses. From these responses, one could project the EOC response as the differential between the combined response and the EEC-only response (namely (EEC+EOC)−EEC). Also, one could use additional signal processing techniques such as phase sensitive detection to minimize potential cross-talk problems.

The source of the pertubation(s) for the EEC/EOC sensors 902 can be one or more external perturbation sources as explained above, including an object itself that is to be imaged (particularly for EOC and EEC nanosensors). For example, a laser source such as a near-field scanning optical microscope (NSOM) can use SAFT techniques to spatially localize a photon field to a small size (on the order of 1 micron or less and less than the spacing between EEC/EOC sensors on the array) that can be scanned/driven in X and Y directions across the array by the piezoelectric X and Y motion controls of a scanning tunneling microscope (STM) to which the NSOM has been attached/adapted. For an array employing both EAC and EOC nanosensors, the STM could be used to perturb any EAC nanosensors while the NSOM could be used to perturb any EOC nanosensors. The NSOM would guide light from the appropriate laser through a submicron-sized aperture at the end of a tapered and metallized optical fiber. The near field method can provide photon fields with a lateral localization as small as 500 nm in the visible region. Further still, a spatially localized field for perturbing EEC nanosensors could be obtained by mounting a tapered metallic tip to the STM scanner and applying a known voltage between the tip and a metallized back surface on the substrate 1204. For both the laser perturbation and the electric field perturbation, the spatial resolution of the applied field would depend on its maintaining close proximity to the surface of the sensor array. Such proximity can be maintained by feedback control of the STM's Z-motion via a signal from the STM (guiding) tip.

It is also worth noting each of the array's EEC/EOC sensors can receive its own biasing current flow such that not all of the array's EEC/EOC sensors will receive the same current flow. For example, EEC/EOC sensors 1-10 of an array may receive current A while EEC/EOC sensors 11-20 of that array may receive current B. As a further example, 20 different currents could also be delivered to the array's 20 EEC/EOC sensors.

Figure 13:
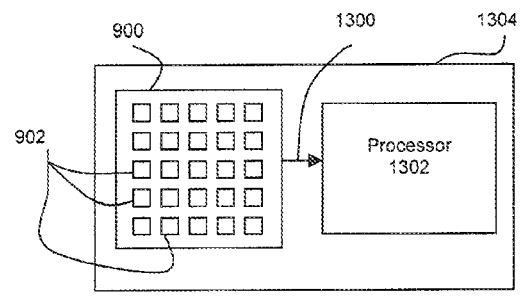
FIG. 13 depicts an exemplary embodiment wherein an array of nanosensors communicates with a processor to serve as a camera.

FIG. 13 depicts an exemplary embodiment wherein an array 900 comprising a plurality of the EOC nanosensors 902 is in communication with a processor 1302. The processor 1302 is configured to receive signals 1300 generated by the EOC nanosensors 902 that reflect the EOC response of those nanosensors to a light perturbation. The processor 902 can then process those signals to generate data corresponding to the EOC effects of the EOC nanosensors 902. In an exemplary embodiment, the array 900 and processor 902 operate together as a camera (e.g., a still camera and/or a video camera), wherein the processor generates images from the signals generated by the EOC nanosensors 902. Such a camera can be deployed in a device 1304 such as a standalone camera device any of a number of devices having a camera integrated therein, including but not limited to portable computing devices such as laptop computers and smart phones. Such portable devices preferably have a screen that is configured to display images corresponding to the image data generated by the camera. Given the nanoscale dimensions and high resolution capabilities of the subject array 900, the array 900-based camera example of FIG. 13 can advantageously replace or supplement the CCD pixel arrays commonly found in many conventional cameras.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof. It should further be understood that the embodiments disclosed herein include any and all combinations of features as disclosed herein and/or described in any of the dependent claims.

What is claimed is:

1. An apparatus comprising:
   a semiconductor layer; and
   a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar;
   wherein the semiconductor layer comprises a mesa portion on which the metal shunt is located, wherein the mesa portion comprises a doped semiconductor epitaxial layer;
   wherein the semiconductor/metal interface is configured as a Schottky barrier interface; and wherein the semiconductor/metal interface is further configured to exhibit a change in resistance thereof corresponding to an inverse extraordinary optoconductance (I-EOC) response in response to the semiconductor/metal interface being perturbed by an optical perturbation.

2. The apparatus of claim 1 wherein the apparatus is configured to transition from a primarily ballistic carrier flow across the semiconductor/metal interface to a primarily diffusive carrier flow across the semiconductor/metal interface in response to the optical perturbation.

3. The apparatus of claim 2 further comprising a plurality of leads in contact with the semiconductor layer.

4. The apparatus of claim 3 wherein the leads comprise:
at least two Ohmic current leads in contact with the semiconductor layer; and
at least two Ohmic voltage leads in contact with the semiconductor layer.

5. The apparatus of claim 4 further comprising a lead in contact with the metal shunt.

6. The apparatus of claim 3 wherein the metal shunt has a nanoscale length and a nanoscale width.

7. The apparatus of claim 6 wherein the leads are positioned to contact the semiconductor layer such that there is a spacing between the leads and the metal shunt on the order of a mean free path for an active layer of the semiconductor layer.

8. The apparatus of claim 6 wherein the semiconductor layer has a nanoscale length and a nanoscale width that is greater than the nanoscale length and the nanoscale width of the metal shunt.

9. The apparatus of claim 1 further comprising a substrate on which the semiconductor layer is located, wherein the metal shunt is not in contact with the substrate.

10. The apparatus of claim 1 wherein the semiconductor/metal interface is configured to exhibit a change in resistance thereof in response to the semiconductor/metal interface being perturbed by an electrical field perturbation.

11. The apparatus of claim 10 wherein the apparatus is configured to exhibit an extraordinary electroconductance (EEC) response to the electrical field perturbation.

12. The apparatus of claim 1 further comprising receiver electronics configured to (1) receive a signal representative of the resistance change and (2) generate image data based on the received signal.

13. The apparatus of claim 12 further comprising an array in communication with the receiver electronics, the array comprising a plurality of optical sensors, each of at least a plurality of the optical sensors comprising the semiconductor layer, the metal shunt, and the semiconductor/metal interface, and wherein the receiver electronics are further configured to generate the image data based on the received signals from the optical sensors in response to the optical perturbation of the optical sensors.

14. An apparatus comprising:
a semiconductor layer, wherein the semiconductor layer comprises an undoped semiconductor epitaxial layer; and
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response in response to the semiconductor/metal interface being perturbed by an optical perturbation.

15. The apparatus of claim 14 wherein the semiconductor layer comprises a mesa portion on which the metal shunt is located.

16. The apparatus of claim 14 further comprising receiver electronics configured to (1) receive a signal representative of the resistance change and (2) generate image data based on the received signal.

17. The apparatus of claim 16 further comprising an array in communication with the receiver electronics, the array comprising a plurality of optical sensors, each of at least a plurality of the optical sensors comprising the semiconductor layer, the metal shunt, and the semiconductor/metal interface, and wherein the receiver electronics are further configured to generate the image data based on the received signals from the optical sensors in response to the optical perturbation of the optical sensors.

18. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar; and
receiver electronics;
wherein the semiconductor/metal interface is configured to (1) exhibit a change in resistance thereof in response to the semiconductor/metal interface being perturbed by an optical perturbation, and (2) exhibit a change in resistance thereof that corresponds to an extraordinary electroconductance (EEC) response in response to the semiconductor/metal interface being perturbed by an electric field perturbation;
wherein the receiver electronics are configured to (1) receive a signal representative of the resistance changes and (2) generate image data based on the received signal; and
wherein the receiver electronics are further configured to sample the received signal when the apparatus is and is not perturbed by the optical perturbation to generate different image data sets representative of the optical response and the EEC response of the apparatus.

19. The apparatus of claim 18 wherein the apparatus is configured to exhibit an inverse extraordinary optoconductance (I-EOC) response to the optical perturbation.

20. The apparatus claim 19 wherein the semiconductor/metal interface is configured as a Schottky barrier interface.

21. A method for an array comprising a plurality of optical sensors and a plurality of extraordinary magnetoresistance (EMR) sensors, the method comprising:
perturbing the first optical sensors in the array with photons to create an extraordinary optoconductance (EOC) effect by the optical sensors, wherein each of the optical sensors comprises (1) a semiconductor layer, (2) a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, and wherein the semiconductor/metal interface is configured to exhibit a change in resistance corresponding to the EOC effect in response to the perturbing step; and perturbing the EMR sensors in the array with a magnetic perturbation to create an EMR effect by the EMR sensors.

22. The method of claim 21 wherein the optical sensors are configured to transition from a primarily ballistic carrier flow across the semiconductor/metal interfaces to a primarily diffusive carrier flow across the semiconductor/metal interfaces in response to the perturbing step.

23. A method comprising:
perturbing a metal-semiconductor hybrid (MSH) device with photons to generate an EOC response, wherein carrier flow within the MSH device across a semiconductor/metal interface transitions from primarily a ballistic transport to a diffusive transport in response to the perturbation by the photons.

24. The method of claim 23 further comprising:
generating an image in response to the EOC response.

25. The method of claim 23 wherein the EOC response comprises an I-EOC response.

26. The method of claim 25 further comprising:
perturbing the MSH device with an electrical charge to create an extraordinary electroconductance (EEC) response by the MSH device.

27. The method of claim 26 further comprising generating an image in response to the created EEC response.

28. The method of claim 26 further comprising performing the photon perturbing step and the electrical charge perturbing step simultaneously.

29. The method claim 26 further comprising performing the photon perturbing step and the electrical charge perturbing step nearly simultaneously.

30. The method of claim 25 further comprising performing the method at room temperature.

31. The method of claim 25 wherein the semiconductor/metal interface is configured as a Schottky barrier interface.

32. The method of claim 25 wherein the MSH device comprises (1) a semiconductor layer, and (2) a metal shunt located on a surface of the semiconductor layer, thereby defining the semiconductor/metal interface through which current flows in response the MSH device being under a voltage, wherein a portion of that semiconductor layer surface is not covered by the metal shunt, wherein the metal shunt has a nanoscale length and a nanoscale width, wherein the semiconductor layer and the metal shunt lie in different planes that are substantially parallel planes, and wherein the semiconductor/metal interface is parallel to the plane of the semiconductor layer.

33. The method of claim 32 wherein the semiconductor layer has a nanoscale length and a nanoscale width that is greater than the nanoscale length and the nanoscale width of the metal shunt.

34. The method of claim 25 wherein the MSH device comprises (1) a semiconductor layer, and (2) a metal shunt located on a surface of the semiconductor layer, thereby defining the semiconductor/metal interface through which current flows in response the MSH device being under a voltage, wherein a portion of that semiconductor layer surface is not covered by the metal shunt, wherein the metal shunt comprises a first metal layer and a second metal layer of different metal types, wherein the semiconductor layer and the metal shunt lie in different planes that are substantially parallel planes, and wherein the semiconductor/metal interface is parallel to the plane of the semiconductor layer.

35. The method of claim 25 wherein the MSH device comprises (1) a semiconductor layer, wherein the semiconductor layer comprises a surface that includes a mesa portion, and (2) a metal shunt located on the mesa portion of the semiconductor layer, thereby defining the semiconductor/metal interface through which current flows in response the MSH device being under a voltage, wherein a portion of the semiconductor layer surface that includes the mesa portion is not covered by the metal shunt, wherein the semiconductor layer and the metal shunt lie in different planes that are substantially parallel planes, and wherein the semiconductor/metal interface is parallel to the plane of the semiconductor layer.

36. The method of claim 35 wherein the mesa comprises a doped semiconductor epitaxial layer.

37. The method of claim 35 wherein the semiconductor layer comprises an undoped semiconductor epitaxial layer.

38. The method of claim 25 wherein the MSH device comprises (1) a semiconductor layer, (2) a metal shunt located on a surface of the semiconductor layer, thereby defining the semiconductor/metal interface through which current flows in response the MSH device being under a voltage, wherein a portion of that semiconductor layer surface is not covered by the metal shunt, and (3) an insulation layer covering an exposed surface of the metal shunt and the semiconductor layer, wherein the semiconductor layer and the metal shunt lie in different planes that are substantially parallel planes, and wherein the semiconductor/metal interface is parallel to the plane of the semiconductor layer.

39. The method of claim 23 wherein the MSH device comprises a plurality of the MSH devices formed into an array.

40. The method of claim 39 wherein the array comprises a plurality of individually-addressable pixels, each pixel corresponding to a different one of the MSH devices.

41. The method of claim 40 further comprising:
generating a multi-pixel image in response to the EOC response.

42. The method of claim 41 wherein the EOC response comprises an I-EOC response.

43. The method of claim 39 further comprising:
perturbing the array with an electrical charge to create an extraordinary electroconductance (EEC) response by the MSH devices.

44. The method of claim 43 further comprising generating a multi-pixel image in response to the created EEC response.

45. The method of claim 43 further comprising performing the photon perturbing step and the electrical charge perturbing step simultaneously.

46. The method of claim 43 further comprising performing the photon perturbing step and the electrical charge perturbing step nearly simultaneously.

47. The method of claim 39 further comprising performing the method at room temperature.

48. The method of claim 39 wherein the perturbing step comprises perturbing the array with photons produced by a light emitting agent that binds to molecules indicative of a pathology, the method further comprising detecting the pathology based on the generated EOC responses of the array's MSH devices.

49. The method of claim 48 wherein the light emitting agent comprises a fluorophore.

50. The method of claim 48 further comprising performing the detecting in vivo.

51. The method of claim 48 further comprising performing the detecting in vitro.

52. The method of claim 39 wherein the perturbing step comprises perturbing the array with photons produced by a light emitting agent that is expressed by a transformed or transfected cell, the method further comprising detecting the transformed or transfected cell based on the generated EOC responses of the array's MSH devices.

53. The method of claim 52 wherein the light emitting agent comprises a fluorophore.

54. The method of claim 52 further comprising performing the detecting in vivo.

55. The method of claim 52 further comprising performing the detecting in vitro.

56. The method of claim 39 wherein the MSH devices in the array comprise nanoscale MSH devices, each of a plurality of the nanoscale MSH devices in the array comprising (1) a semiconductor layer, and (2) a metal shunt located on a surface of the semiconductor layer, thereby defining the semiconductor/metal interface through which current flows in response the MSH device being under a voltage, wherein a portion of that semiconductor layer surface is not covered by the metal shunt, wherein the semiconductor layer and the metal shunt lie in different planes that are substantially parallel planes, and wherein the semiconductor/metal interface is parallel to the plane of the semiconductor layer.

57. The method of claim 23 further comprising performing contact imaging based on the EOC response.

58. The method of claim 23 further comprising performing an astronomical detection based on the EOC response.

59. The method of claim 23 further comprising performing an astronomical observation based on the EOC response.

60. The method of claim 23 wherein the MSH device is resident in a camera, the method further comprising generating a camera image based on the EOC response.

61. The method of claim 23 wherein the camera comprises a video camera and wherein the camera image comprises a video image.

62. The method of claim 23 further comprising performing a cancer detection based on the EOC response.

63. The method of claim 23 further comprising performing a blood analysis based on the EOC response.

64. The method of claim 23 further comprising performing a nanoparticle diffusion and size study based on the EOC response.

65. The method of claim 23 further comprising performing a position-sensitive detection operation based on the EOC response.

66. The method of claim 23 further comprising performing the method in connection with optical information storage and detection.

67. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar; and
a plurality of leads in contact with the semiconductor layer but not the metal shunt such that there is a spacing between the metal shunt and the leads that is any value in a range of approximately 1 nm to approximately 1000 nm.

68. The apparatus of claim 67 wherein the semiconductor layer comprises a doped semiconductor layer and an undoped semiconductor layer, wherein the doped semiconductor layer contacts the metal shunt to form the semiconductor/metal interface, and wherein the undoped semiconductor layer does not contact the metal shunt.

69. The apparatus of claim 68 wherein the leads contact the doped semiconductor layer, and wherein the apparatus further comprises an insulation layer that isolates the leads from the undoped semiconductor layer.

70. The apparatus of claim 67 further comprising a lead in contact with the metal shunt.

71. The apparatus of claim 67 wherein the semiconductor layer and the metal shunt are formed into a van der Pauw (vdP) plate.

72. A method comprising:
biasing a metal-semiconductor hybrid (MSH) device, wherein the MSH device has a semiconductor/metal interface;
perturbing the MSH device with light such that a carrier flow across the semiconductor/metal interface transitions from a primarily ballistic transport to a primarily diffusive transport; and
detecting a voltage signal from the MSH device in response to the perturbing step.

73. An apparatus comprising:
a plurality of sensors, each of the plurality of the sensors being configured to generate a signal representative of an extraordinary optoconductance (EOC) response in response to a perturbation by light; and
a processor for communication with the sensors, the processor configured to generate data corresponding to the generated signals; and
wherein each of the plurality of sensors comprises:
a semiconductor layer; and
a metal shunt located on a surface of the semiconductor layer, thereby defining a semiconductor/metal interface, wherein the semiconductor/metal interface comprises a Schottky interface; and
wherein each of the plurality of sensors is configured to exhibit an I-V characteristic that changes from a Schottky characteristic to an Ohmic characteristic in response to increasing illumination.

74. The apparatus of claim 73 wherein the semiconductor layers and metal shunts of the plurality of sensors exhibit nanoscale dimensions.

75. The apparatus of claim 74 wherein the each of the plurality of the sensors is configured to generate a signal representative of an inverse extraordinary optoconductance (I-EOC) response in response to a perturbation by light.

76. The apparatus of claim 74 wherein the processor is configured to generate image data corresponding to the generated signals, the image data comprising a plurality of pixels, and wherein the plurality of the sensors comprise an array of the sensors, the sensors corresponding to the pixels.

77. The apparatus of claim 76 wherein the apparatus comprises a camera.

78. The apparatus of claim 77 wherein the camera comprises a video camera.

79. The apparatus of claim 77 wherein the camera is resident on a portable computing device.

80. The apparatus of claim 79 wherein the portable computing device comprises a smart phone.

81. The apparatus of claim 76 wherein each of at least a plurality of the sensors is configured to generate a signal representative of an extraordinary electroconductance (EEC) response in response to a perturbation by an electric field, and wherein the processor is further configured to generate image data corresponding to the EEC and EOC signals.

82. The apparatus of claim 74 wherein each of at least a plurality of the sensors is configured to generate a signal representative of an extraordinary electroconductance (EEC) response in response to a perturbation by an electric field, and wherein the processor is further configured to generate data corresponding to the EEC and EOC signals.

83. The apparatus of claim 74 wherein each of the plurality of the sensors is configured to transition from a primarily ballistic carrier flow across its semiconductor/metal interface to a primarily diffusive carrier flow across its semiconductor/metal interface in response to the light perturbation.

84. The apparatus of claim 73 wherein the sensors comprise nanoscale sensors, wherein, for each nanoscale sensor, (1) the metal shunt only covers a portion of the semiconductor layer surface upon which it is located, (2) the semiconductor layer and the metal shunt lie in different planes that are substantially parallel planes, and (3) the semiconductor/metal interface is parallel to the plane of the contact surface between the semiconductor layer and the metal shunt.

85. A method comprising:
detecting light at room temperature using an individually-addressable nanoscale hybrid metal-semiconductor optical sensor that exhibits positive photoresistance and photo-induced switching from a primarily ballistic carrier flow to a primarily diffusive carrier flow in response to a perturbation by light.

86. An apparatus comprising:
an individually-addressable nanoscale hybrid metal-semiconductor optical sensor that is configured to exhibit positive photoresistance and photo-induced switching from a primarily ballistic carrier flow to a primarily diffusive carrier flow in response to a perturbation by light.

87. The apparatus of claim 86 further comprising a processor for communication with the sensor, the processor configured to generate data corresponding to the exhibited positive photoresistance in response to the light perturbation.

88. The apparatus of claim 87 further comprising a plurality of the individually-addressable nanoscale hybrid metal-semiconductor optical sensors arranged in an array, the processor for communication with the array and configured to generate image data corresponding to the exhibited positive photoresistance from the optical sensors in response to the light perturbation.

89. The apparatus of claim 88 wherein each of at least a plurality of the optical sensors in the array comprises (1) a semiconductor layer, and (2) a metal shunt located on a surface of the semiconductor layer, thereby defining the semiconductor/metal interface through which current flows in response the sensor being under a voltage, wherein a portion of that semiconductor layer surface is not covered by the metal shunt, wherein the semiconductor layer and the metal shunt lie in different planes that are substantially parallel planes, and wherein the semiconductor/metal interface is parallel to the plane of the semiconductor layer.

90. The apparatus of claim 89 further comprising a camera, the array and the processor being resident in the camera.

91. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar;
a plurality of leads in contact with the semiconductor layer, wherein the leads comprise (1) at least two Ohmic current leads in contact with the semiconductor layer, and (2) at least two Ohmic voltage leads in contact with the semiconductor layer; and
an insulation layer disposed between the current and voltage leads and the semiconductor layer such that the current and voltage leads only contact a portion of the semiconductor layer;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response where carrier flow across the semiconductor/metal interface transitions from a primarily ballistic carrier flow to a primarily diffusive carrier flow in response to the semiconductor/metal interface being perturbed by an optical perturbation.

92. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, wherein the metal shunt has a nanoscale length and a nanoscale width; and
a plurality of leads in contact with the semiconductor layer, wherein the leads are positioned to contact the semiconductor layer such that there is a spacing of approximately 50 nm between the leads and the metal shunt on the order of a mean free path for an active layer of the semiconductor layer;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response where carrier flow across the semiconductor/metal interface transitions from a primarily ballistic carrier flow to a primarily diffusive carrier flow in response to the semiconductor/metal interface being perturbed by an optical perturbation.

93. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, wherein the metal shunt has a nanoscale length and a nanoscale width; and
a plurality of leads in contact with the semiconductor layer, wherein the leads are positioned to contact the semiconductor layer such that there is a spacing between the leads and the metal shunt on the order of a mean free path for an active layer of the semiconductor layer, wherein the spacing is any value in a range of approximately 1 nm to approximately 1000 nm;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response where carrier flow across the semiconductor/metal interface transitions from a primarily ballistic carrier flow to a primarily diffusive carrier flow in response to the semiconductor/metal interface being perturbed by an optical perturbation.

94. An apparatus comprising:
a semiconductor layer; and
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, wherein the metal shunt comprises a first metal layer and a second metal layer of different metal types;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response in response to the semiconductor/metal interface being perturbed by an optical perturbation.

95. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar; and
an insulation layer covering an exposed surface of the metal shunt and the semiconductor layer;
wherein the semiconductor/metal interface is configured as a Schottky barrier interface; and
wherein the semiconductor/metal interface is further configured to exhibit a change in resistance thereof corresponding to an inverse extraordinary optoconductance (I-EOC) response in response to the semiconductor/metal interface being perturbed by an optical perturbation.

96. An apparatus comprising:
a semiconductor layer;
a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar; and
receiver electronics;
wherein the semiconductor/metal interface is configured as a Schottky barrier interface;
wherein the semiconductor/metal interface is further configured to (1) exhibit a change in resistance thereof corresponding to an inverse extraordinary optoconductance (I-EOC) response in response to the semiconductor/metal interface being perturbed by an optical perturbation, and (2) exhibit a change in resistance thereof corresponding to an extraordinary electroconductance (EEC) response in response to the semiconductor/metal interface being perturbed by an electric field perturbation;
wherein the receiver electronics are configured to (1) receive a signal representative of the resistance changes, and (2) generate image data based on the received signal; and
wherein the receiver electronics are further configured to sample the received signal when the apparatus is and is not perturbed by the optical perturbation to generate different image data sets representative of the I-EOC response and the EEC response of the apparatus.

97. A method for an array comprising a plurality of a optical sensors and a plurality of extraordinary piezoconductance (EPC) sensors, the method comprising:
perturbing the optical sensors in the array with photons to create an extraordinary optoconductance (EOC) effect by the optical sensors, wherein each of the optical sensors comprises (1) a semiconductor layer, (2) a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, and wherein the semiconductor/metal interface is configured to exhibit a change in resistance corresponding to the EOC effect in response to the perturbing step; and
perturbing the EPC sensors in the array with a piezo perturbation to create an EPC effect by the EPC sensors.

98. A method for an array comprising a plurality of optical sensors and a plurality of extraordinary acoustoconductance (EAC) sensors, the method comprising:
perturbing the optical sensors in the array with photons to create an extraordinary optoconductance (EOC) effect by the optical sensors, wherein each of the optical sensors comprises (1) a semiconductor layer, (2) a metal shunt located on a surface of the semiconductor layer, thereby defining a semiconductor/metal interface, wherein a portion of the semiconductor layer surface is not covered by the metal shunt, and wherein the semiconductor layer and the metal shunt are in substantially parallel planes but are not co-planar, and wherein the semiconductor/metal interface is configured to exhibit a change in resistance corresponding to the EOC effect in response to the perturbing step; and
perturbing the EAC sensors in the array with an acoustic perturbation to create an EAC effect by the EAC sensors.

* * * * *